United States Patent
Shih et al.

(10) Patent No.: US 11,217,560 B2
(45) Date of Patent: Jan. 4, 2022

(54) DIE ASSEMBLY AND METHOD OF MANUFACTURING THE SAME

(71) Applicant: NANYA TECHNOLOGY CORPORATION, New Taipei (TW)

(72) Inventors: Chiang-Lin Shih, New Taipei (TW); Pei-Jhen Wu, Taipei (TW); Ching-Hung Chang, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/665,310

(22) Filed: Oct. 28, 2019

(65) Prior Publication Data
US 2021/0125966 A1    Apr. 29, 2021

(51) Int. Cl.
*H01L 25/065*    (2006.01)
*H01L 23/00*    (2006.01)

(52) U.S. Cl.
CPC .......... *H01L 25/0657* (2013.01); *H01L 24/19* (2013.01); *H01L 24/20* (2013.01); *H01L 2225/06524* (2013.01); *H01L 2225/06541* (2013.01)

(58) Field of Classification Search
CPC ................. H01L 25/0657; H01L 24/19; H01L 2225/06524; H01L 2225/06541
See application file for complete search history.

(56) References Cited

U.S. PATENT DOCUMENTS

| | | | |
|---|---|---|---|
| 2008/0124845 A1* | 5/2008 | Yu | H01L 24/73 438/143 |
| 2009/0130846 A1* | 5/2009 | Mistuhashi | H01L 21/76898 438/667 |
| 2015/0021784 A1* | 1/2015 | Lin | H01L 24/92 257/774 |
| 2015/0279825 A1* | 10/2015 | Kang | H01L 21/76898 257/48 |
| 2016/0155724 A1* | 6/2016 | Kim | H01L 24/94 257/48 |

FOREIGN PATENT DOCUMENTS

TW    201911535 A    3/2019

OTHER PUBLICATIONS

Office Action dated Jan. 19, 2021 in TW Application No. 109123471, 7 pages.
Office Action dated Apr. 7, 2021 in TW Application No. 109123471, 8 pages.

* cited by examiner

*Primary Examiner* — Peniel M Gumedzoe
(74) *Attorney, Agent, or Firm* — Muncy, Geissler, Olds and Lowe, P.C.

(57) ABSTRACT

The present disclosure provides a die assembly. The die assembly includes a first die, a second die and a third die stacked together. The first die includes a plurality of first metal lines facing a plurality of second metal lines of the second die, and a second substrate beneath the second metal lines faces a plurality of third metal lines of the third die. The die assembly further includes at least one first plug, a first redistribution layer and a second redistribution layer. The first plug penetrates through the second substrate to connect to at least one of the second metal lines. A first redistribution layer physically connects at least one of the first metal lines to at least one of the second metal lines, and a second redistribution layer physically connects at least one of the third metal lines to the first plug.

14 Claims, 28 Drawing Sheets

DIE ASSEMBLY AND METHOD OF MANUFACTURING THE SAME

TECHNICAL FIELD

The present disclosure relates to a semiconductor device and a method of manufacturing the same, and more particularly, to a die assembly and a method of manufacturing the same.

DISCUSSION OF THE BACKGROUND

As integrated circuit technologies continue to advance, ongoing efforts are made to increase performance and density. One approach explored by designers to realize such benefits is the implementation of stacked three-dimensional integrated circuits. Some areas where three-dimensional integrated circuits are suitable for consideration include stacking of two of more chips that are fabricated using the same or different fabrication processes to reduce the footprint of the integrated circuit system.

This Discussion of the Background section is provided for background information only. The statements in this Discussion of the Background are not an admission that the subject matter disclosed in this Discussion of the Background section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a die assembly. The die assembly includes a first die, a second die, a third die, at least one first plug, a first redistribution layer and a second redistribution layer. The first die includes a first substrate and a plurality of first metal lines disposed over the first substrate. The second die includes a second substrate and a plurality of second metal lines disposed over the second substrate, wherein the first die is stacked on the second die and the second metal lines face the first metal lines. The third die includes a third substrate and a plurality of third metal lines over the third substrate, wherein the second die is stacked on the third die and the third metal lines face the second substrate. The first plug penetrates through the second substrate to connect to at least one of the second metal lines. The first redistribution layer physically connects at least one of the first metal lines to at least one of the second metal lines, and the second redistribution layer physically connects at least one of the third metal lines to the first plug.

In some embodiments, the first redistribution layer is aligned with the first metal line farthest from the first substrate and the second redistribution layer is aligned with the first plug.

In some embodiments, the die assembly further includes a first dielectric layer between the first die and the second die and encircling the first redistribution layer, and a second dielectric layer between the second die and the third die and encircling the second redistribution layer.

In some embodiments, the die assembly further includes at least one second plug penetrating through the third substrate and contacting at least one of the third metal lines.

In some embodiments, the die assembly further includes a third redistribution layer and a passivation layer; the third redistribution layer in contact with the second interconnect structure, and the passivation layer encircles the third redistribution layer.

In some embodiments, the die assembly further includes at least one solder bump electrically coupled to the third redistribution layer.

In some embodiments, the die assembly further includes a first barrier liner and a second barrier liner; the first barrier liner is disposed between the second substrate and the first plug and between the second metal line and the first plug, and the second barrier liner is disposed between the third substrate and the second plug and between the third metal line and the second plug.

Another aspect of the present disclosure provides a method of manufacturing a die assembly. The method includes steps of providing a first die comprising a first substrate and a plurality of first metal lines over the first substrate; forming a first re-routing layer physically connected to at least one of the first metal lines; providing a second die comprising a second substrate and a plurality of second metal lines over the second substrate; forming a second re-routing layer aligned with the first re-routing layer and in contact with at least one of the second metal lines; bonding the first re-routing layer to the second re-routing layer to form a first redistribution layer; forming at least one first plug penetrating through the second substrate and contacting at least one of the second metal lines; forming a third re-routing layer contacting the first plug; providing a third die comprising a third substrate and a plurality of third metal lines over the third substrate; forming a fourth re-routing layer aligned with the third re-routing layer and in contact with at least one of the third metal lines; and bonding the third re-routing layer to the fourth re-routing layer to form a second redistribution layer.

In some embodiments, the method further includes steps of depositing a blanket dielectric over the first substrate and connecting to the first metal lines farthest from the first substrate; performing a first etching process to expose portions of the first metal line, farthest from the first substrate, through the blanket dielectric and thus form a first dielectric film; and performing a plating process to form the first re-routing layer on the first metal line exposed through the first dielectric film.

In some embodiments, the method further includes steps of depositing a second dielectric film to cover portions of the second metal line farthest from the second substrate before the forming of the second re-routing layer; and bonding the first dielectric film and the second dielectric film simultaneously with the bonding of the first re-routing layer and the second re-routing layer.

In some embodiments, the forming of the third re-routing layer includes steps of depositing a first precursor layer on the second substrate and the first plug; and patterning the first precursor layer to remove portions of the first precursor layer that do not contact the first plug, wherein the third re-routing layer is aligned with the first plug.

In some embodiments, the method further includes steps of depositing a third dielectric film to surround the third re-routing layer; depositing a fourth dielectric film to cover portions of the third metal line farthest from the third substrate before the forming of the fourth re-routing layer; and bonding the third dielectric film and the fourth dielectric film simultaneously with the bonding of the third re-routing layer and the fourth re-routing layer.

In some embodiments, the method further includes steps of forming at least one second plug penetrating through the third substrate and contacting at least one of the third metal lines; and forming a third redistribution layer contacting the second plug.

In some embodiments, the method further includes a step of performing a grinding process to thin the first substrate after the forming of the third redistribution layer.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
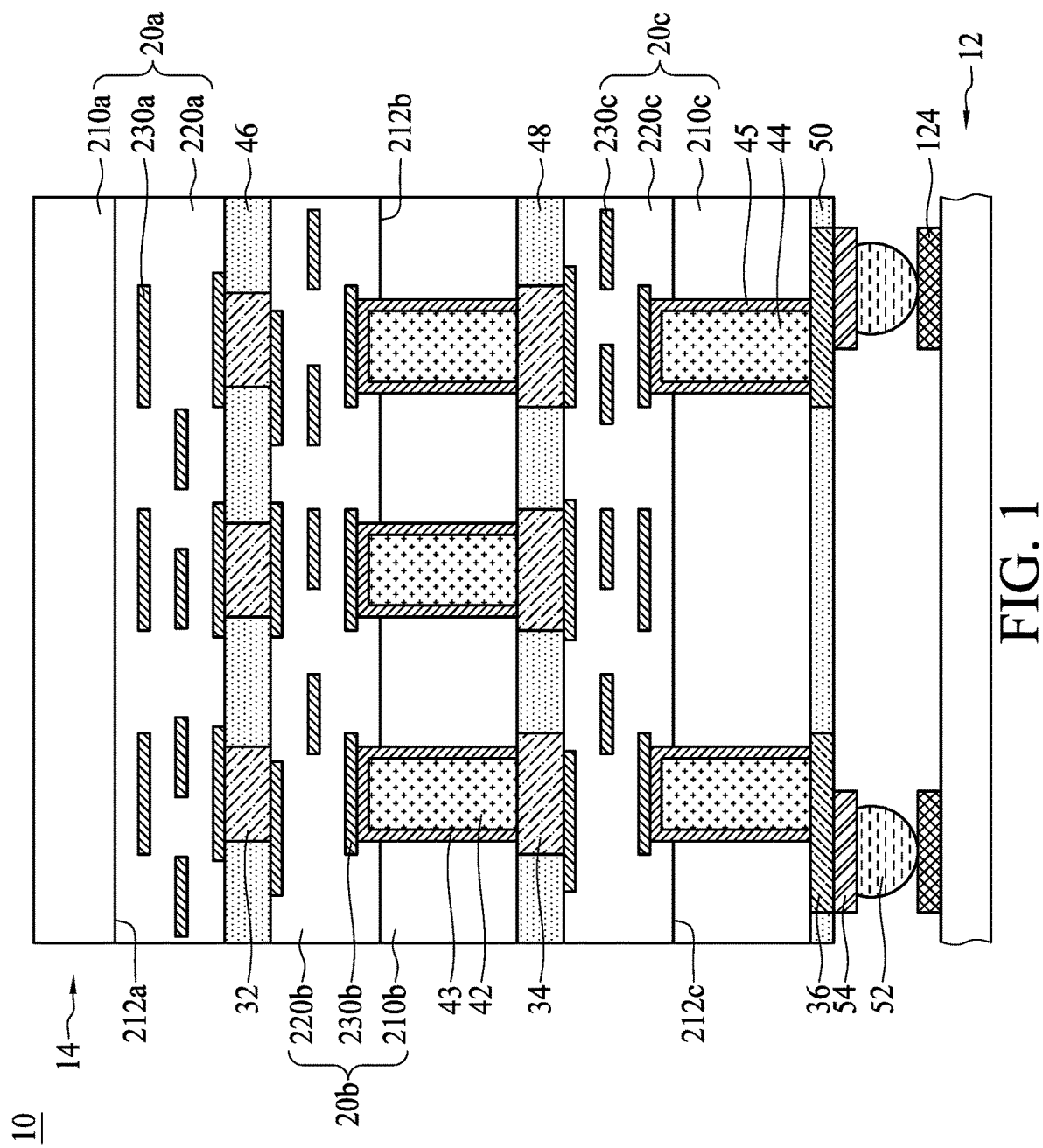
FIG. 1 is a cross-sectional view of a semiconductor system in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a cross-sectional view of a semiconductor system 10 in accordance with some embodiments of the present disclosure. Referring to FIG. 1, the semiconductor system 10 includes a main board 12 and a die assembly 14 including a first die 20a, a second die 20b and a third die 20c aligned and bonded together, wherein the third die 20c is disposed closest to the main board 12. The main board 12 may be a printed circuit board (PCB) of an electronic system (such as a computer system) and includes a plurality of wiring pads 124 for making physical and electrical connection to the die assembly 14.

In some embodiments, the first die 20a, the second die 20b, and the third die 20c may be fabricated using the same fabrication processes to form, for example, a memory stack. However, the first to third dies 20a to 20c may be fabricated using different fabrication processes to stack one or more memory devices with one or more processors or application-specific integrated circuit (ASIC) devices.

The first die 20a, farthest from the main board 12, includes a first substrate 210a, a first inter-layer dielectric (ILD) layer 220a disposed on a first front surface 212a of the first substrate 210a, and a plurality of first metal lines 230a in the first ILD layer 220a. In some embodiments, the first ILD layer 220a faces the main board 12. The second die 20b, sandwiched between the first die 20a and the third die 20c, includes a second substrate 210b, a second ILD layer 220b disposed on a second front surface 212b of the second substrate 210b and facing the first ILD layer 220b, and a plurality of second metal lines 230b disposed in the second ILD layer 220b. The third die 20c includes a third substrate 210c, a third ILD layer 220c disposed on a front surface 212c of the third substrate 210c, and a plurality of third metal lines 230c disposed in the third ILD layer 220c.

The die assembly 14 further includes a first redistribution layer 32 between the first die 20a and the second die 20b and serving as an electrical interconnection to the first die 20a and the second die 20b. Specifically, the first redistribution layer 32 contacts the first metal lines 230c, farthest from the first substrate 210a and exposed through the second ILD layer 220a, and the second metal lines 230b exposed through the second ILD layer 220b. In some embodiments, the first redistribution layer 32 serves to bond the first die 20a and the second die 20b. In some embodiments, a first dielectric layer 46 is applied between the first die 20a and the second die 20b and encloses the first redistribution layer 32 to reduce corrosion of the first redistribution layer 32. The first dielectric layer 46 may also serve to bond the first die 20a and the second die 20b to increase mechanical strength of attachment therebetween.

The die assembly 14 also includes a second redistribution layer 34 serving to bond the second die 20b and the third die 20c, and includes one or more first plugs 42 serving as electrical connection to the second die 20b and the second redistribution layer 34. In detail, the first plugs 42 penetrate through the second substrate 210b and into the second ILD layer 220b and contact the second metal lines 230b closest to the second substrate 210b. The second redistribution layer 34, between the second die 20b and third die 20c, connects the first plugs 42 to the third metal lines 230c exposed through the third ILD layer 220c. In some embodiments, a second dielectric layer 48 is disposed between the second die 20b and the third die 20c and surrounds the second redistribution layer 34.

In some embodiments, the die assembly 14 may further include one or more second plugs 44 penetrating through the third substrate 210c and into the third ILD layer 220c to connect the third metal lines 230c, closest to the third substrate 210c, to a third redistribution layer 36 on the third substrate 210c and a passivation layer 50 encircling the third redistribution layer 36.

In some embodiments, one or more solder bumps 52, electrically coupled to the third redistribution layer 36, are located in a position corresponding to the wiring pads 124 to make physical and electrical connection thereto. In other words, the solder bumps 52 serve as input/output (I/O) connections to electrically connect the die assembly 14 to the main board 12. In some embodiments, one or more under bump metallization (UBM) members 54, including copper and/or aluminum, are sandwiched between the third redistribution layer 36 and the solder bumps 52 for good bondability with the solder bumps 52.

In some embodiments, the die assembly 14 may include a first barrier liner 43 surrounding first plugs 42 and a second barrier liner 45 surrounding the second plugs 44. The first barrier liner 43 and the second barrier liner 45, acting as glue layers, include refractory metals, refractory metal nitrides, refractory metal silicon nitrides or combinations thereof.

Figure 2:
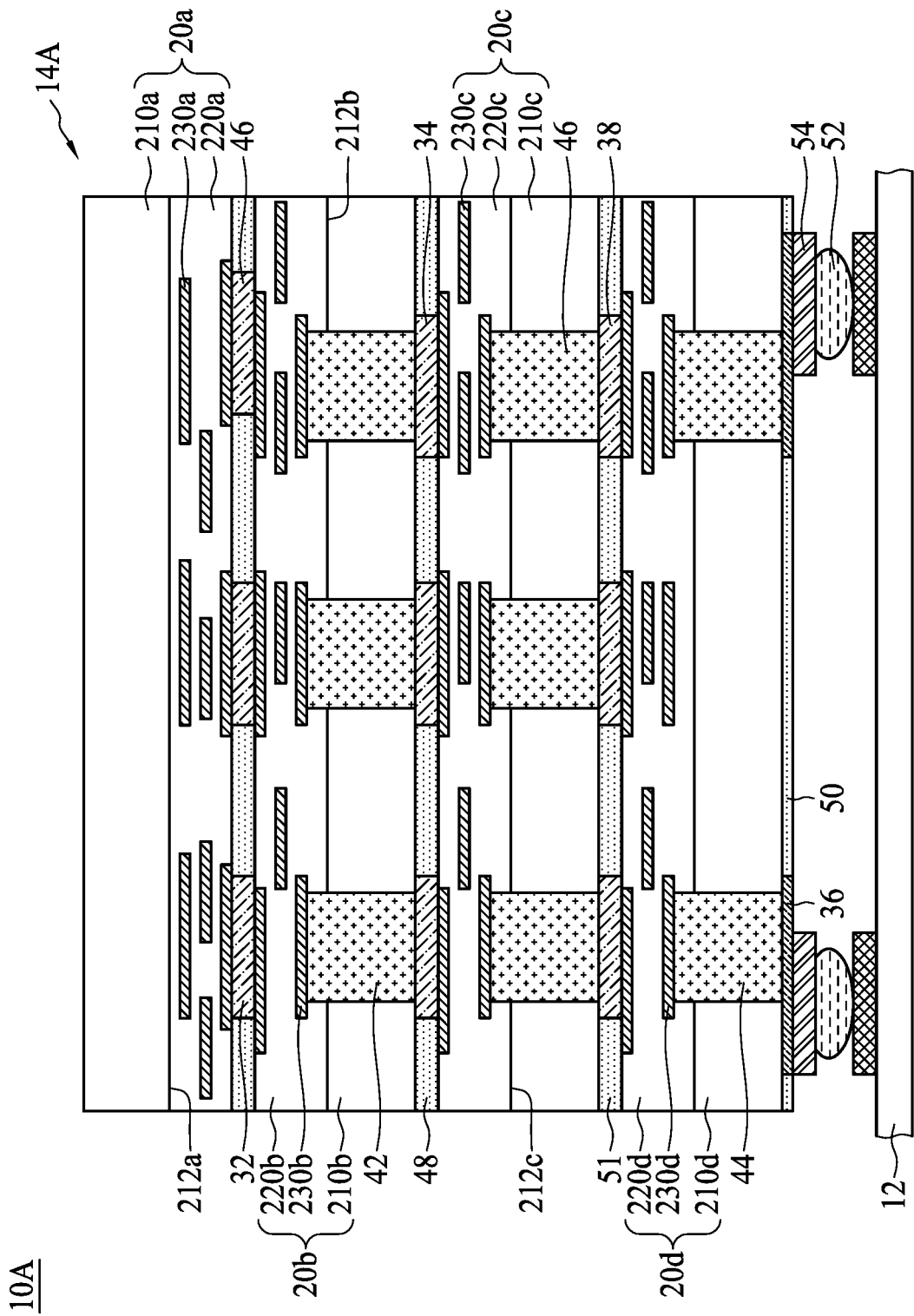
FIG. 2 is a cross-sectional view of a semiconductor system in accordance with some embodiments of the present disclosure.

FIG. 2 is a cross-sectional view of a semiconductor system 10A in accordance with some embodiments of the present disclosure. Referring to FIG. 2, the semiconductor system 10A includes a main board 12 and a die assembly 14A mounted on the main board 12. The die assembly 14A includes first to fourth dies 20a to 20d aligned and bonded together, wherein the fourth die 20s is positioned closest to the main board 12. In some embodiments, the first die 20a and the second die 20b are vertically stacked in a front-to-front configuration, and the second die 20b, the third die 20c and the fourth die 20d are vertically stacked in a front-to-back configuration.

The die assembly 14A further includes a first redistribution layer 32 serving to bond the first die 20a to the second die 20b. In some embodiments, the first redistribution layer 32, disposed between a first ILD layer 220a of the first die 20a and a second ILD layer 220b of the second die 20b, contacts first metal lines 230a exposed through the first ILD layer 220a to second metal lines 230b exposed through the second ILD layer 220b. In some embodiments, a first dielectric layer 46 applied to surround the first redistribution layer 32 also serves to bond the first die 20a and the second die 20b. In some embodiments, the first die 20a and the second die 20b are bonded through a hybrid bonding including the first redistribution layer 32 and the first dielectric layer 46.

The die assembly 14A further includes a second redistribution layer 34 and one or more first plugs 42 that collectively serve as electrical connections to the second die 20b and the third die 20c. The second redistribution layer 34 contacts third metal lines 230c exposed through a third ILD layer 220c of the third die 20c. The first plugs 42, penetrating through a second substrate 210b of the second die 20b and into the second ILD layer 220b, connect the second redistribution layer 34 to the second metal lines 230b in the second ILD layer 220b. In some embodiments, the second metal lines 230b contacting the first redistribution layer 32 and the second metal lines 230b contacting the first plugs 42 are in different tiers. In detail, the second metal lines 230b contacting the first redistribution layer 32 are positioned farthest from the second substrate 210b, and the second metal lines 230b contacting the first plugs 42 are positioned closest to the second substrate 210b. In some embodiments, the second redistribution layer 34 and a second dielectric layer 48, between the second die 20b and the third die 20c, form a bonding interface for bonding the second die 20b to the third die 20c.

In some embodiments, the die assembly 14A also includes one or more second plugs 44 penetrating through the fourth substrate 210d to connect the fourth metal lines 230d to a fourth redistribution layer 36 on the fourth substrate 210d, a passivation layer 50 encircling the third redistribution layer 36, one or more solder bumps 52, electrically coupled to the third redistribution layer 36, and one or more UBM members 54 sandwiched between the third redistribution layer 36 and the solder bumps 52.

In some embodiments, a fourth redistribution layer 38 and one or more third plugs 46 collectively serve as electrical connections to the third die 20c and the fourth die 20d. More particularly, the fourth redistribution layer 38 contacts fourth metal lines 230d exposed through a fourth ILD layer 220d of the fourth die 20d, and the third plug 46 penetrates a third substrate 210c of the third die 20c to connect the third redistribution layer 38 to the third metal lines 230c in the third ILD layer 220c. In some embodiments, a fourth dielectric layer 51 is applied to surround the fourth redistribution layer 51 and bond the third die 20c to the fourth die 20d.

Figure 3:
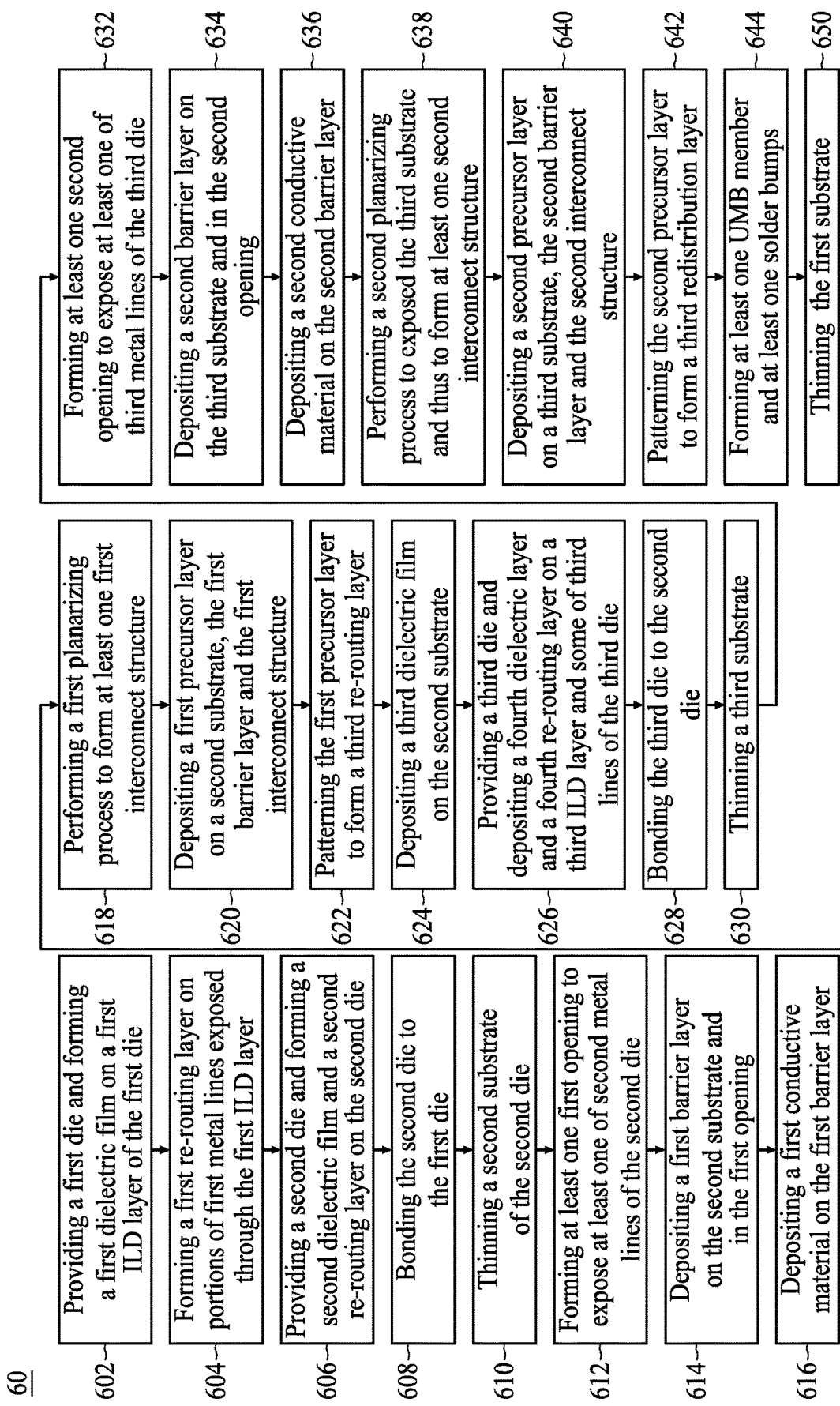
FIG. 3 is a flow diagram illustrating a first part of a method of manufacturing a die assembly in accordance with some embodiments of the present disclosure.

FIG. 3 is a flow diagram illustrating a method 60 of manufacturing a die assembly 14 in accordance with some embodiments of the present disclosure. FIGS. 4 to 28 are schematic diagrams illustrating various fabrication stages constructed according to the method 60 for manufacturing the semiconductor device 14 in accordance with some embodiments of the present disclosure. The stages shown in FIGS. 4 to 28 are also illustrated schematically in the flow diagram in FIG. 3. In the subsequent discussion, the fabrication stages shown in FIGS. 4 to 28 are discussed in reference to the process steps shown in FIG. 3.

Figure 4:
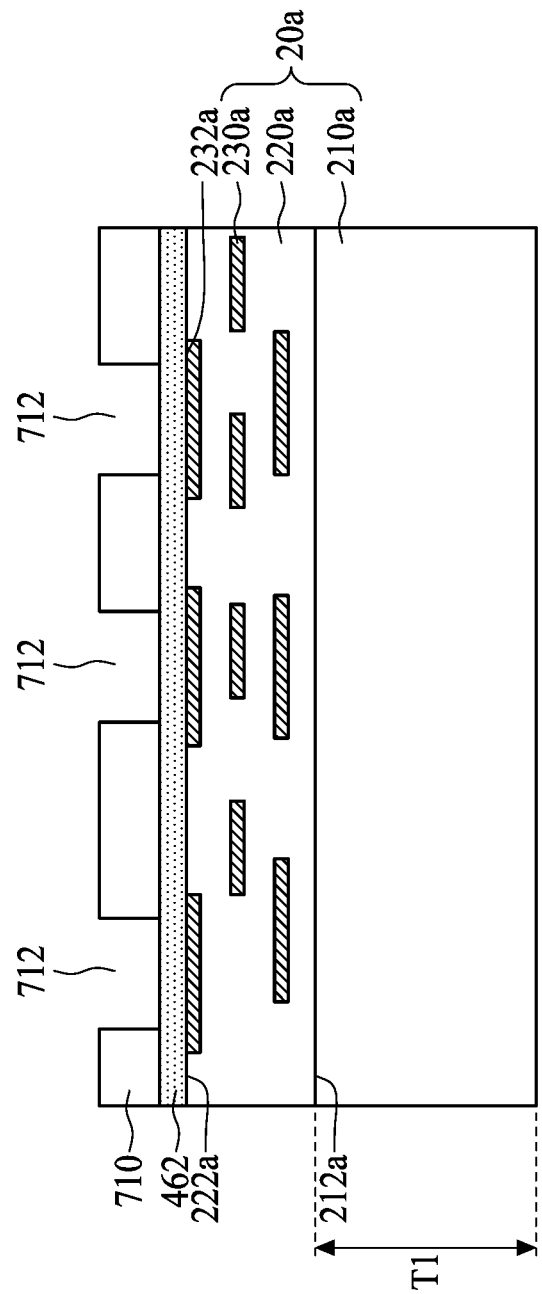
FIGS. 4 through 28 illustrate cross-sectional views of intermediate stages in the formation of a die assembly in accordance with some embodiments of the present disclosure.

Referring to FIG. 4, a first die 20a is provided according to a step 602 in FIG. 3. In some embodiments, the first die 20a includes a first substrate 210a, a first ILD layer 220a on a front surface 212a of the first substrate 210a, and a plurality of first metal lines 230a in the first ILD layer 220a. In some embodiments, the first substrate 210a includes silicon or other semiconductor material such as a III-V component. In some embodiments, the first substrate 210a may include various layers that are not separately depicted and that combine to form various microelectronic elements, doped regions and isolation features. In some embodiments, the first substrate 210a has an original thickness T1, which may be, for example, equal to or greater than 775 μm.

In some embodiments, the first ILD layer 220a, including one or more dielectric layers, is comprised of oxide, nitrite or a low-K dielectric material (such as phosphosilicate glass, borophosphosilicate glass or the like). In some embodiments, the first ILD layer 220a has an approximately planar top surface 222a. In some embodiments, the first ILD layer 220a may be formed using a spinning process or a chemical vapor deposition (CVD) process.

In some embodiments, the first metal lines 230a formed in the first ILD layer 220a provide electrical connection to the microelectronic elements and/or doped regions. In some embodiments, some of the first metal lines 230a, farthest from the first substrate 210a, are exposed through the first ILD layer 220a. The first metal lines 230a exposed through the first ILD layer 220a have top surfaces 232a, which are coplanar with the top surface 222a of the first ILD layer 220a. The first metal lines 230a may include copper, aluminum, tungsten or the like. In some embodiments, the first die 20a may further include a plurality of vias (not shown) connected to the metal lines 230a in different tiers, wherein the first die 20a shown in FIG. 4 includes three tiers of first metal lines 230; however, in alternative embodiments, the first die 20a may include any number of tiers of the first metal lines 230a.

Next, a blanket dielectric 462 is deposited to cover the top surface 222a of the first ILD layer 220a and the top surfaces 232a of the first metal lines 230. The blanket dielectric 462, including oxide and/or nitride, is formed, for example, using a CVD process.

Figure 5:
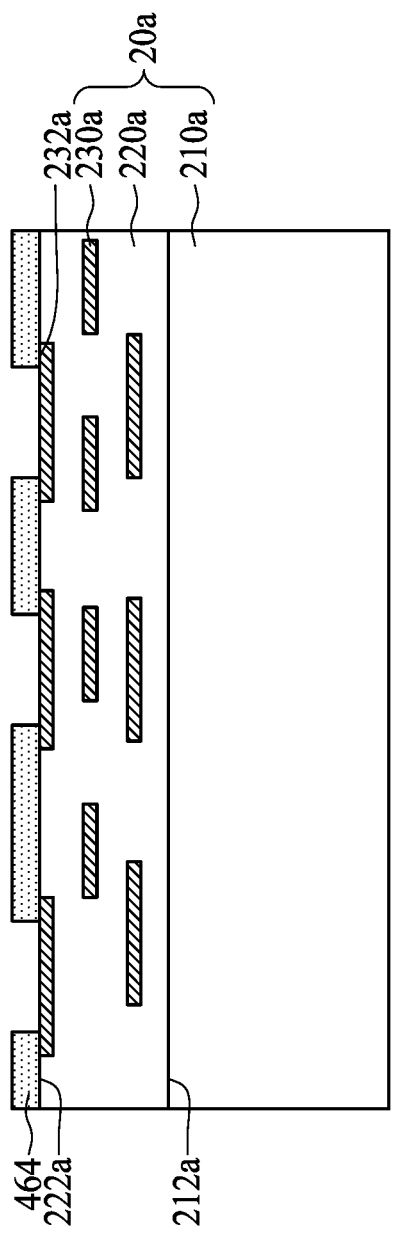

Next, a first mask 710, including one or more windows 712 to expose portions of the blanket dielectric 462, is provided on the blanket dielectric 462, and a first etching process is performed to etch the blanket dielectric 462 through the windows 712. Accordingly, a first dielectric film 464 is formed, and portions of the first metal lines 230a are exposed through the first dielectric film 464, as shown in FIG. 5. After the first etching process is performed, the first mask 710 is removed.

Figure 6:
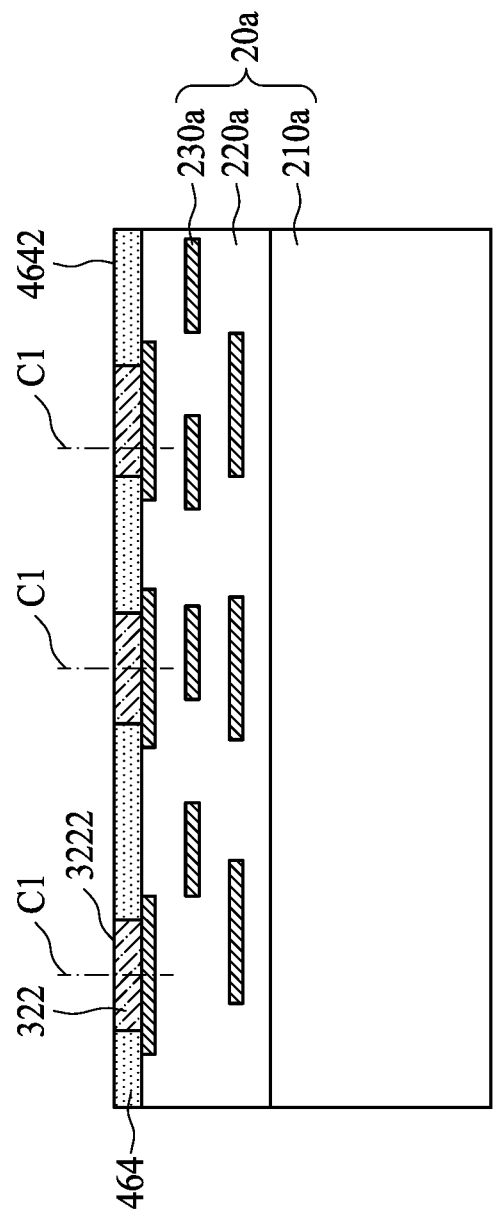

Referring to FIG. 6, in some embodiments, a plating process is performed to form a first re-routing layer 322 on the first metal lines 230a exposed through the first dielectric film 464 according to a step 604 in FIG. 3. In some embodiments, the first re-routing layer 322 may be centered on a central axis C1 of the first metal lines 230a exposed through the first dielectric film 464 when viewed in a cross-sectional view. In some embodiments, the first re-routing layer 322 has a top surface 3222, which is coplanar with a top surface 4642 of the first dielectric film 464. In some embodiments, the first re-routing layer 322 may include copper, aluminum, tungsten, cobalt, titanium, gold, platinum or a combination thereof.

Figure 7:
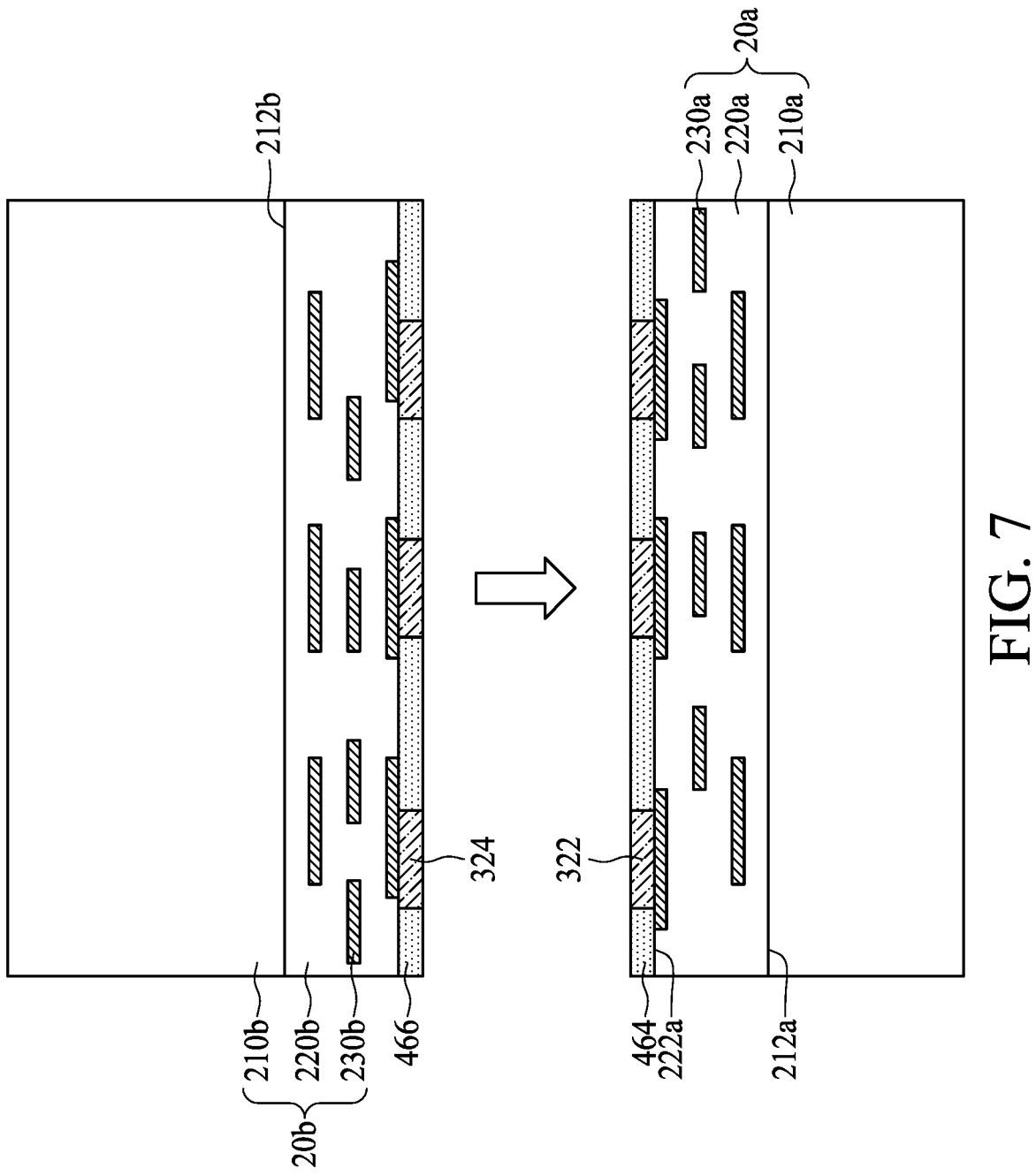

Referring to FIG. 7, in some embodiments, a second die 20b is provided, and a second dielectric film 466 and a second re-routing layer 324 are formed on the second die 20b according to a step 606 in FIG. 3. In some embodiments, the second die 20b, arranged upside down in FIG. 7, includes a second substrate 210b, a second ILD layer 220b on a second front surface 212b of the second substrate 210b, and a plurality of second metal lines 230b disposed in the second ILD layer 220b. In some embodiments, the second re-routing layer 324 is aligned with the first re-routing layer 322 and contacts the second metal lines 230b exposed through the second ILD layer 220b. The second dielectric film 466 encircles the second re-routing layer 324. In some embodiments, the materials and formation methods of the second dielectric film 466 and the second re-routing layer 324 are essentially the same as those of the first dielectric film 464 and the first re-routing layer 322.

Figure 8:
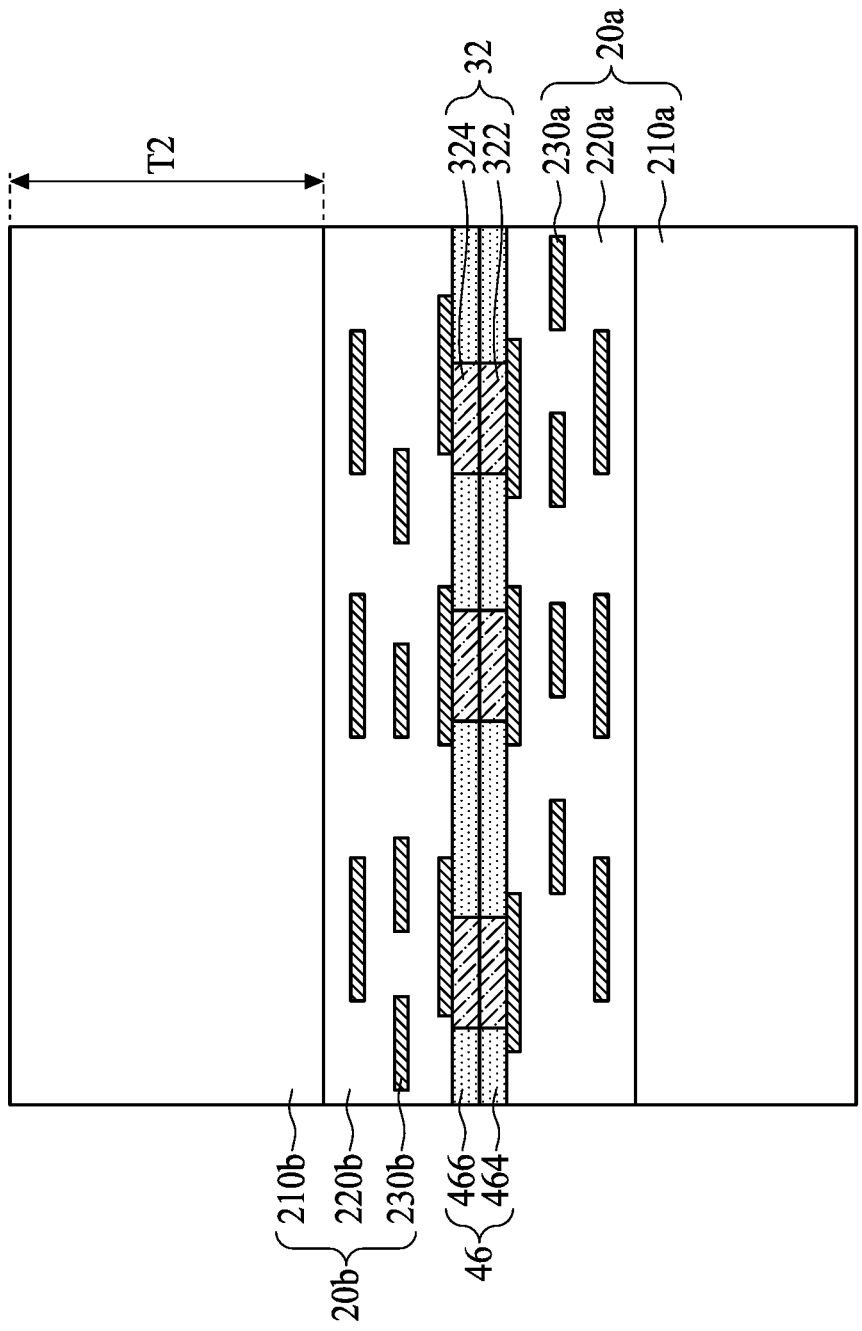

Referring to FIG. 8, in some embodiments, the second die 20b is aligned with and bonded to the first die 20a according to a step 608 in FIG. 3. After the second die 20b and the first die 20a are bonded, an anneal process is performed to bond the first re-routing layer 322 to the second re-routing layer 324, thus forming the first redistribution layer 32, and fuse the first dielectric film 464 to the second dielectric film 466, thus forming a first dielectric layer 46. In some embodiments, the second substrate 210b has thickness T2, which is about 755 μm. In some embodiments, the first die 20a and the second die 20b are bonded through, for example, a hybrid bonding process.

Figure 9:
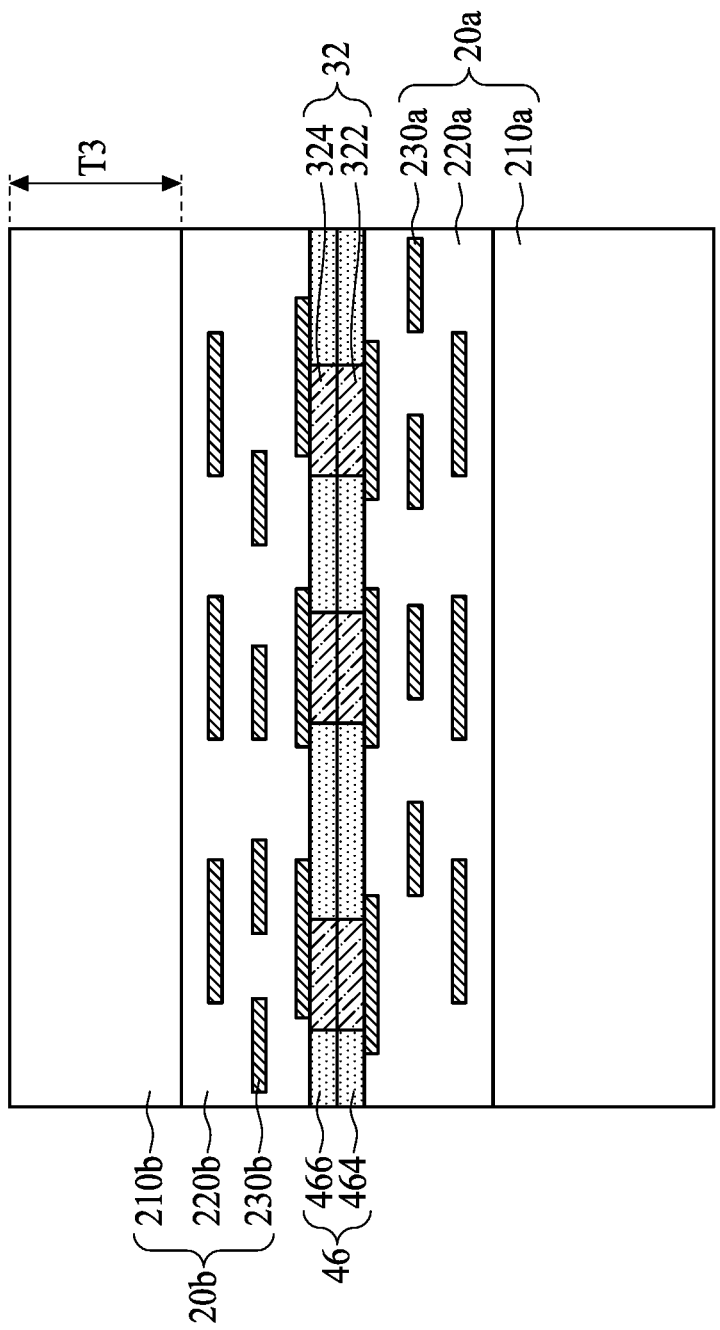

Referring to FIG. 9, in some embodiments, a first thinning process is performed to thin the second substrate 210b according to a step 610 in FIG. 3. In some embodiments, the second substrate 210b is thinned to reduce processing time for forming first plugs, as will be described below. In FIG. 9, the second substrate 210b is thinned to a thickness T3, which is about 50 μm.

Figure 10:
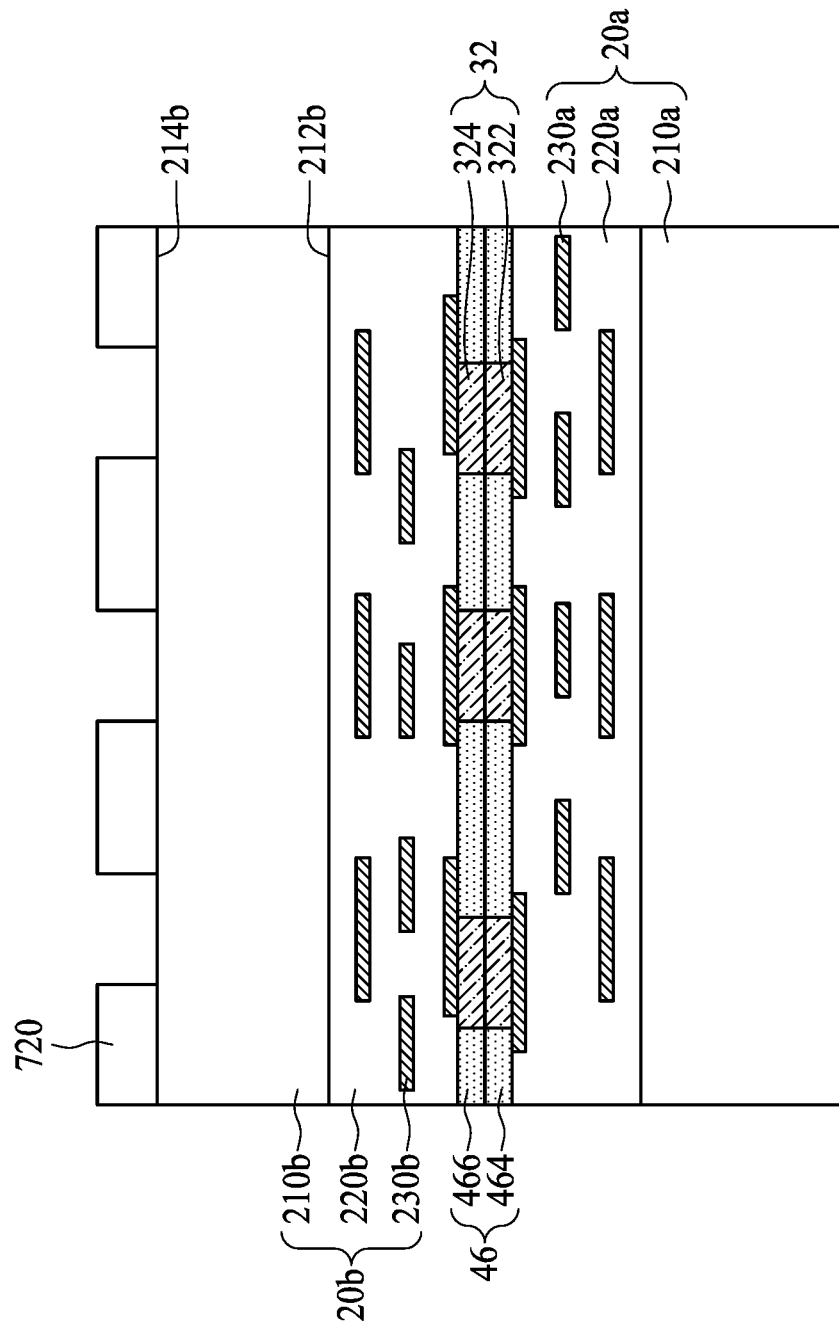
Figure 11:
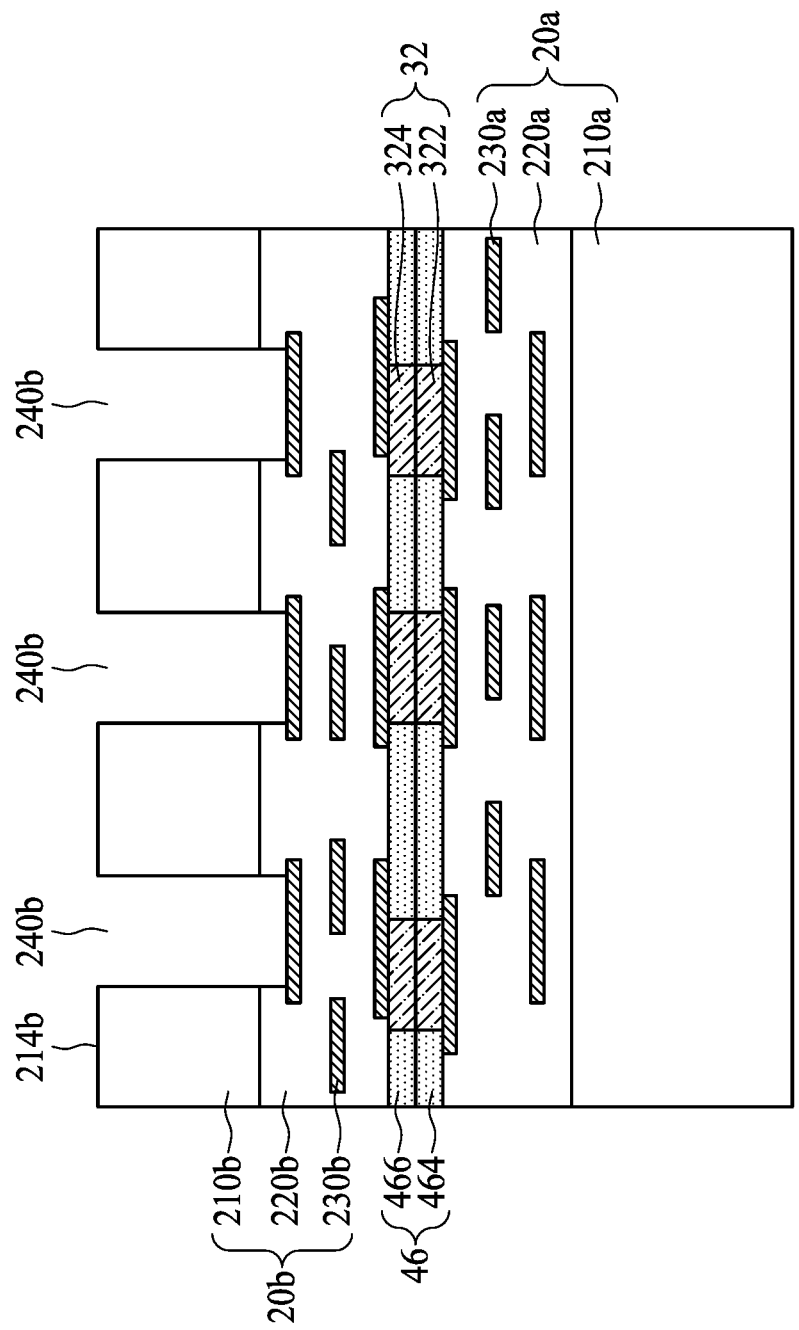

Referring to FIGS. 10 and 11, in some embodiments, one or more first openings 240b are formed to expose the second metal lines 230b, closest to the second substrate 210a, according to a step 612 in FIG. 3. In some embodiments, the first opening 240b is formed by providing a second mask 720 on a second back surface 214b, opposite to the second front surface 212a, and performing a second etching process to remove portions of the second substrate 210b and second ILD layer 220b that are not covered by the second mask 720. After the second etching process is performed, the second mask 720 is removed, for example, by an ashing process or a wet strip process.

Figure 12:
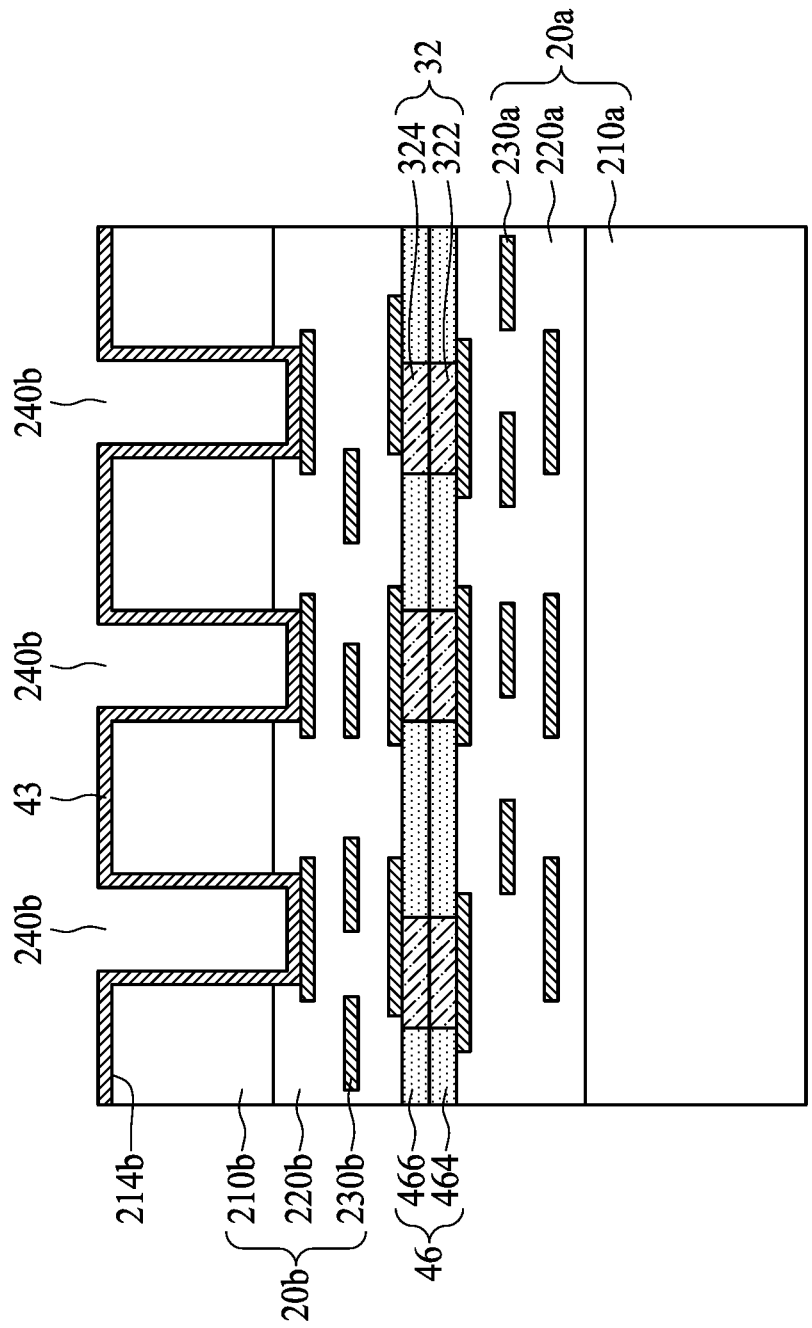

Referring to FIG. 12, in some embodiments, a first barrier liner 43 is optionally deposited on the second back surface 214b and in the first opening 240b according to a step 614 in FIG. 3. In some embodiments, the first barrier liner 43 is a substantially conformal layer and formed using a physical vapor deposition (PVD) process, for example.

Figure 13:
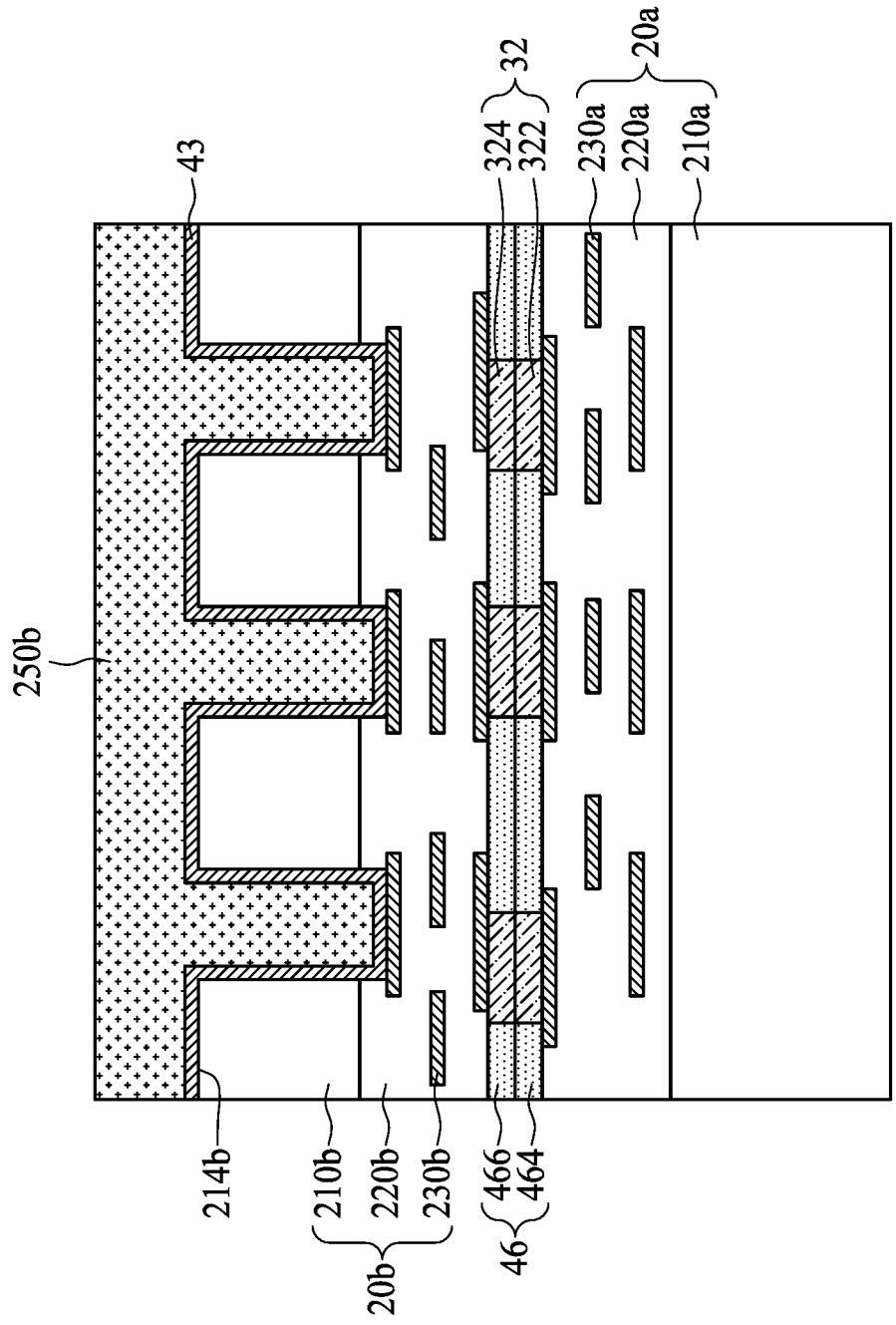

Referring to FIG. 13, in some embodiments, a first conductive material 250b is deposited on the first barrier liner 43 according to a step 616 in FIG. 3. In some embodiments, the first conductive material 250b is deposited over the second back surface 214b by using an electroplating process or a CVD process.

Figure 14:
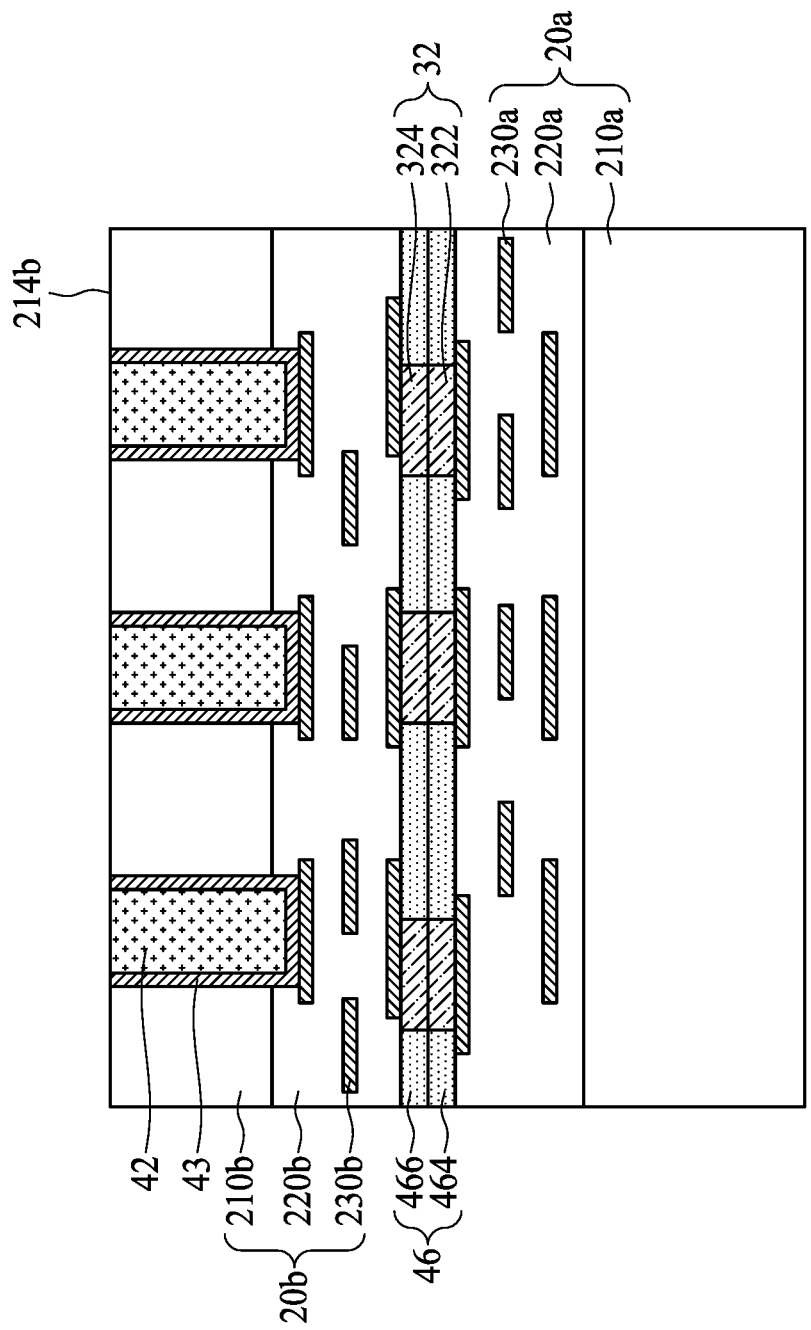

Referring to FIG. 14, in some embodiments, a first planarizing process is performed to expose the second substrate 210b according to a step 618 in FIG. 3. Accordingly, one or more first plugs 42 are formed. In some embodiments, the first barrier liner 43 and the first conductive material 250b are planarized down to the second back surface 214b. In some embodiments, the first planarizing process includes a chemical mechanical polishing (CMP) process and/or wet etching process.

Figure 15:
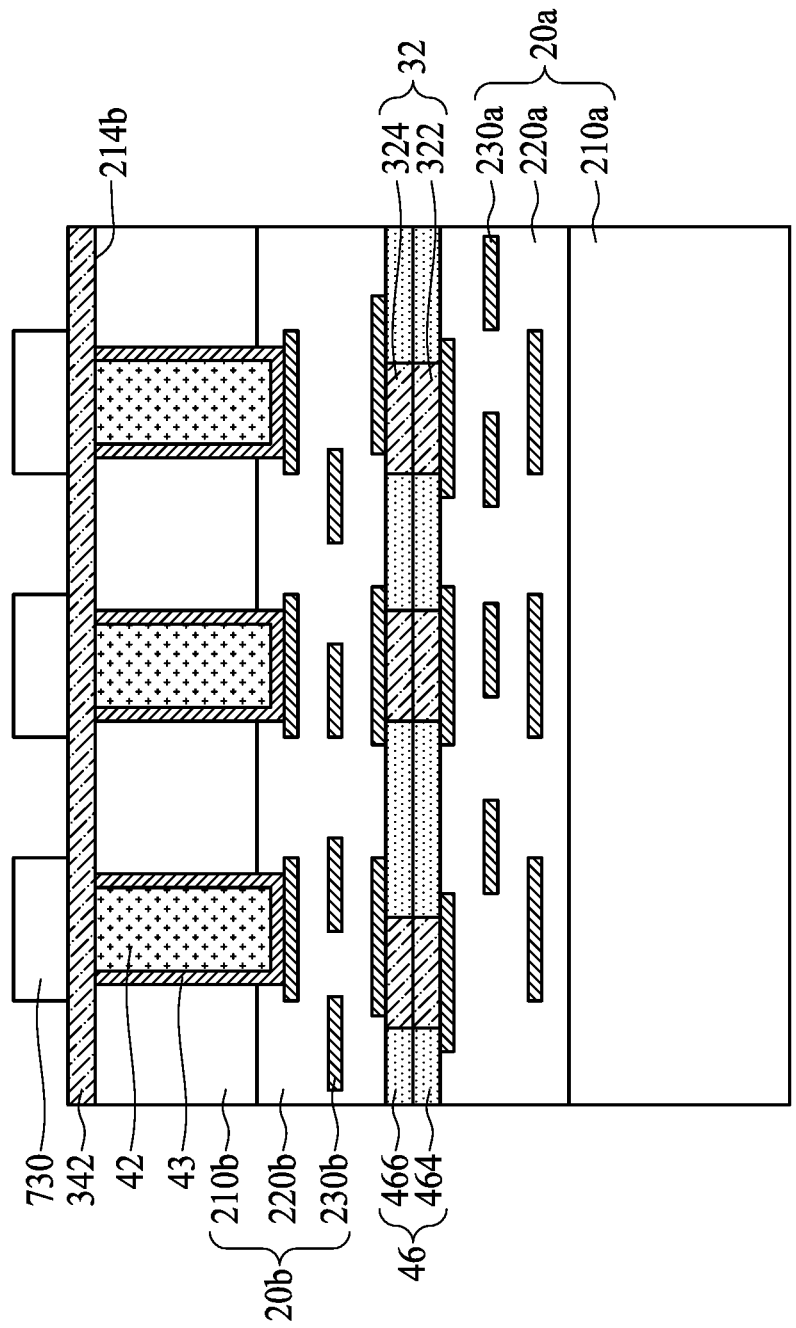

Referring to FIG. 15, in some embodiments, a first precursor layer 342 is deposited to cover the second back surface 214b, the first plugs 42 and the first barrier liner 43 according to a step 620 in FIG. 3. In some embodiments, the first precursor layer 342, including aluminum, tungsten, cobalt, titanium, gold, platinum or alloys thereof, is formed utilizing a CVD process, a PVD process, a sputtering process, an evaporation process or an electroplating process. Next, a third mask 730 is provided on the first precursor layer 342 to pattern the first precursor layer 342. In some embodiments, the first plugs 42 are disposed beneath the third mask 730.

Figure 16:
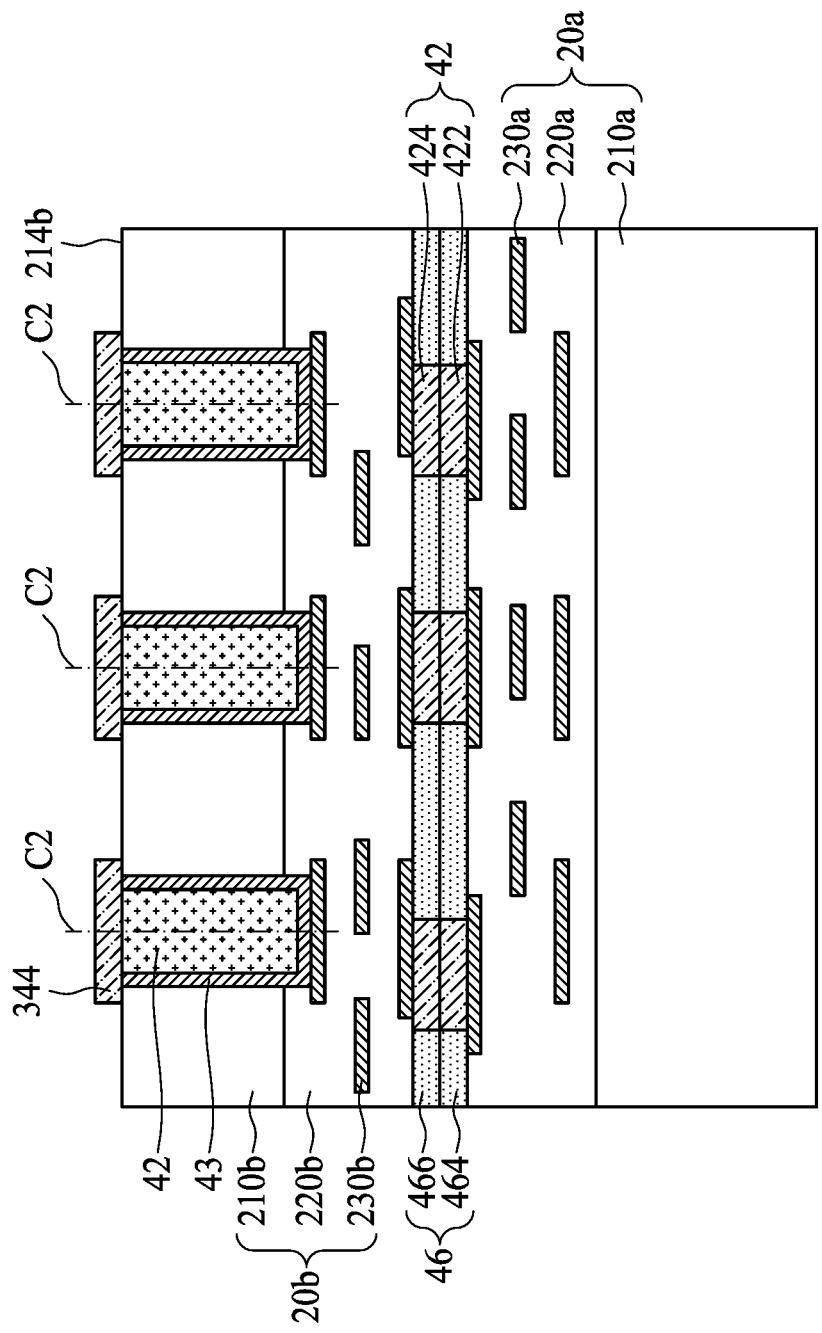

Referring to FIG. 16, in some embodiments, a third etching process is performed to etch the first precursor layer 342 through the third mask 730 and thus form a third re-routing layer 344 according to a step 622 in FIG. 3. After the third etching process is performed, the third mask 730 is removed. In some embodiments, the third re-routing layer 344 may be centered on a central axis C2 of the first plugs 42 when viewed in a cross-sectional view. In some embodiments, the third re-routing layer 344 covers portions of the second back surface 214b.

Figure 17:
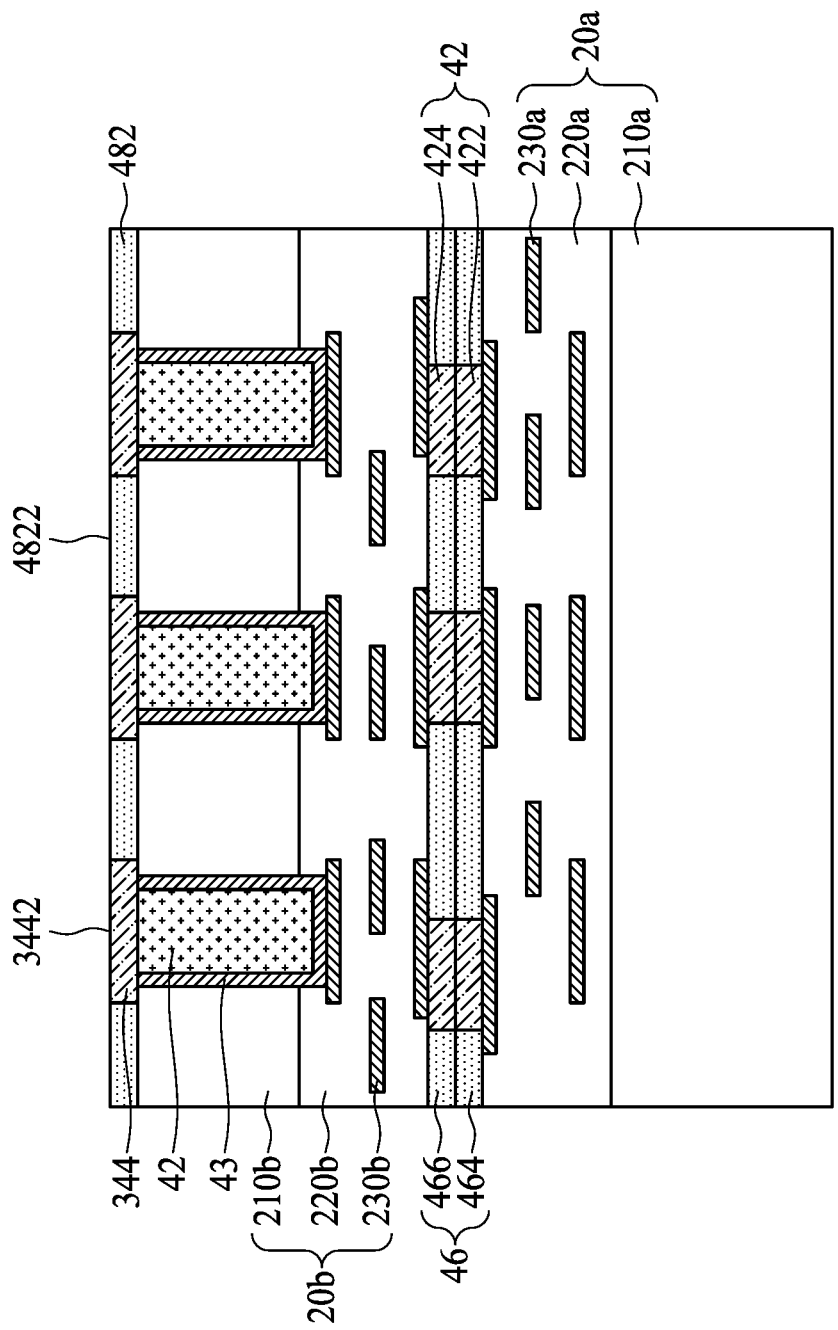

Referring to FIG. 17, in some embodiments, a third dielectric film 482 is deposited on the second back surface 214b surrounding the third re-routing layer 344 according to a step 624 in FIG. 3. In some embodiments, the third re-routing layer 344 has a top surface 3442 that is coplanar with a top surface 4822 of the third dielectric film 482. In some embodiments, the third dielectric layer 344 may be formed using a CVD process, for example.

Figure 18:
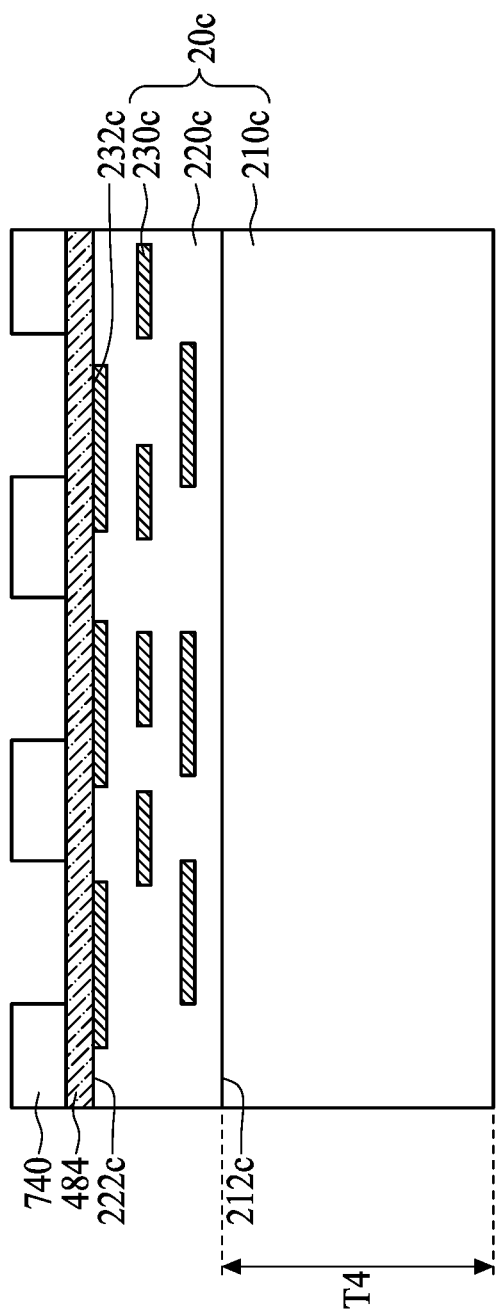
Figure 19:
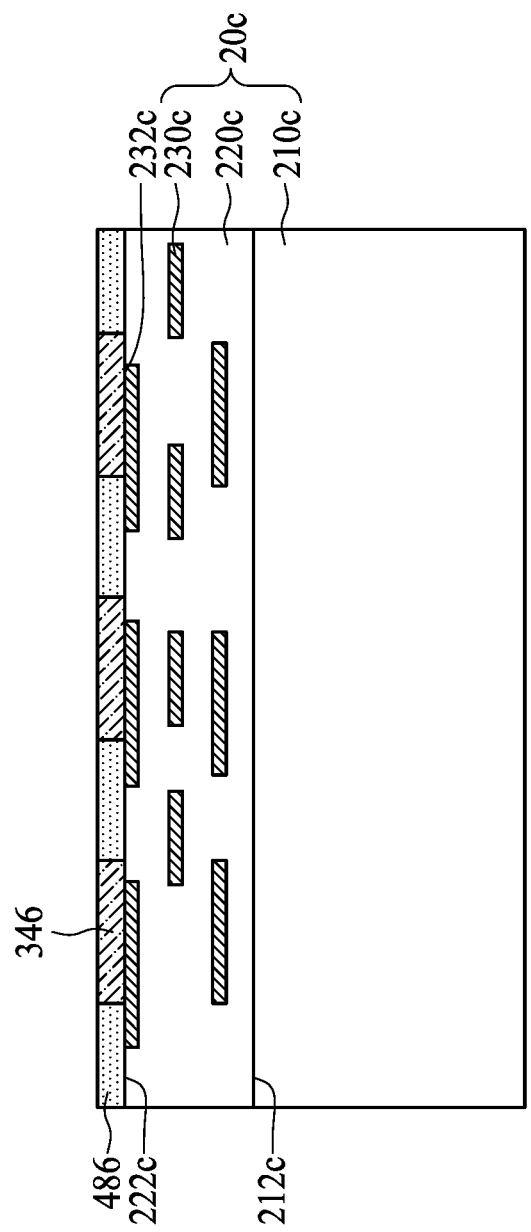

Referring to FIGS. 18 and 19, in some embodiments, a third die 20c is provided and a fourth re-routing layer 346 and a fourth dielectric film 486 are formed on the third die 20c according to a step 626 in FIG. 3. In FIG. 18, a dielectric material 484 is deposited on the third ILD layer 220c using a CVD process for example, and a fourth mask 740 is then provided on the dielectric material 484 to define a pattern for forming the fourth re-routing layer 346. In some embodiments, the third ILD layer 220c is disposed on a third substrate 210c of the third die 20c and has a top surface 222c coplanar with top surfaces 232c of the third metal lines 230c exposed through the third ILD layer 220c. The third substrate 210c in FIG. 18 has a thickness T4 greater than 750 μm.

Next, a fourth etching process is performed to etch the dielectric material 484, so that the fourth dielectric film 486 is formed. A plating process is then performed to form the fourth re-routing layer 346 on the third ILD layer 220c and the third metal lines 230c exposed through the fourth dielectric film 486. In some embodiments, the fourth re-routing layer 346 and the third re-routing layer 344 (shown in FIG. 17) have identical patterns.

Figure 20:
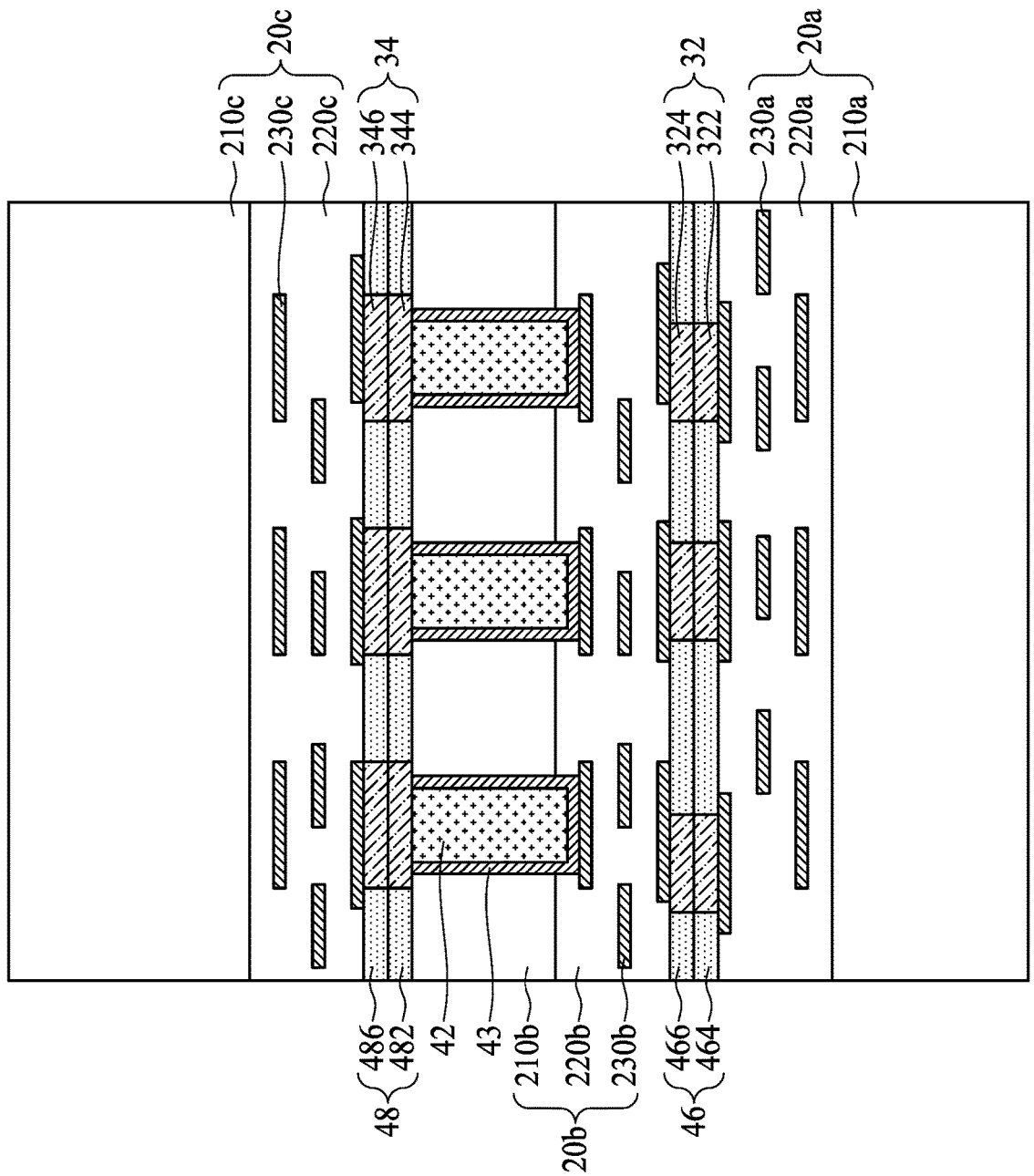

Referring to FIG. 20, in some embodiments, the third die 20c, arranged upside down, is stacked on and bonded to the second die 20b according to a step 628 in FIG. 3. In some embodiments, the fourth re-routing layer 346 is aligned with the third re-routing layer 344. In some embodiments, the fourth re-routing layer 346 is bonded to the third re-routing layer 344 to form the second redistribution layer 34, and the third dielectric film 482 is bonded to the fourth dielectric layer 486 to form the second dielectric layer 48.

Figure 21:
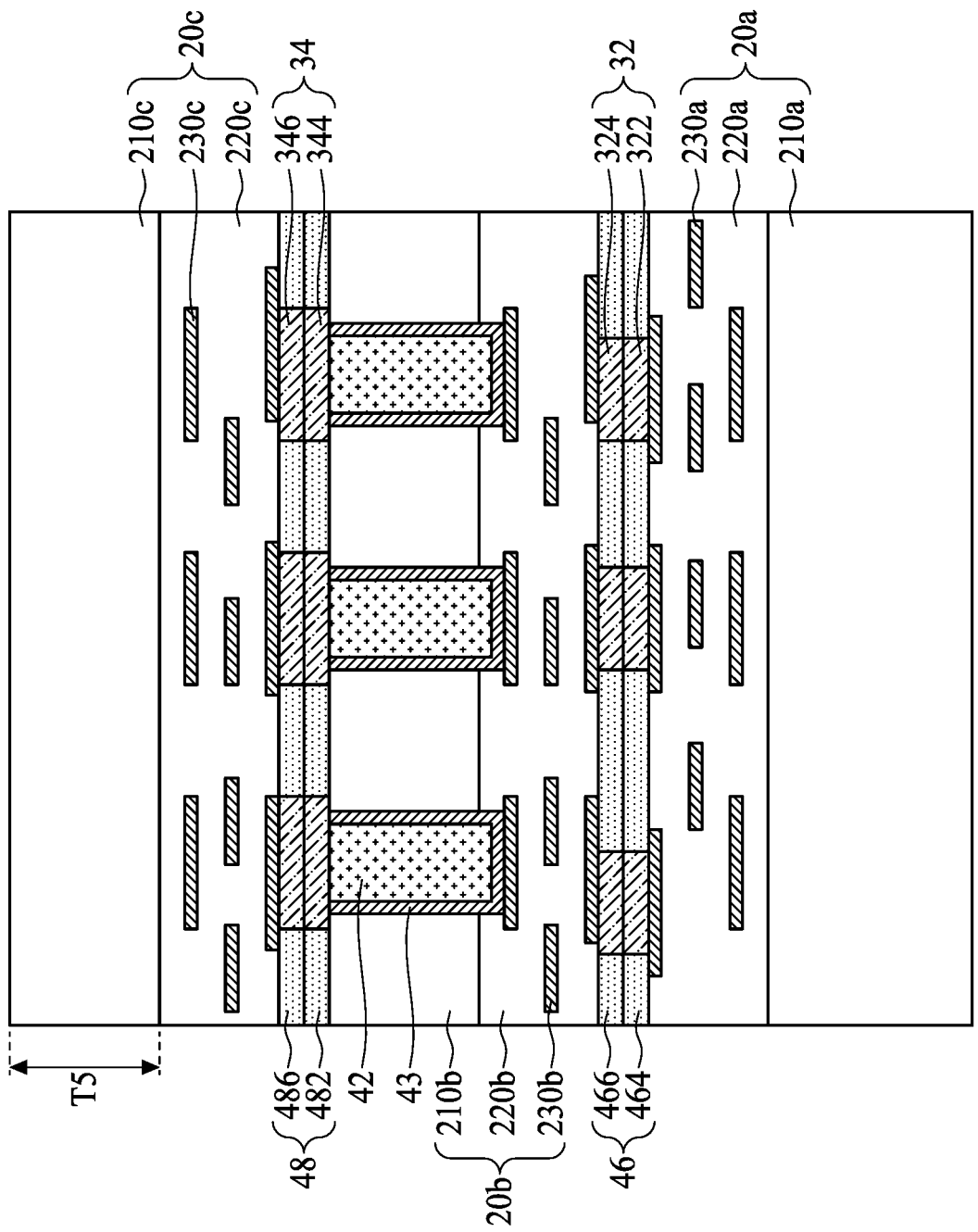

Referring to FIG. 21, in some embodiments, a second thinning process is performed to thin the third substrate 210c according to a step 630 in FIG. 3. The third substrate 210c, in FIG. 21, has thickness T5, which is about 50 μm.

Figure 22:
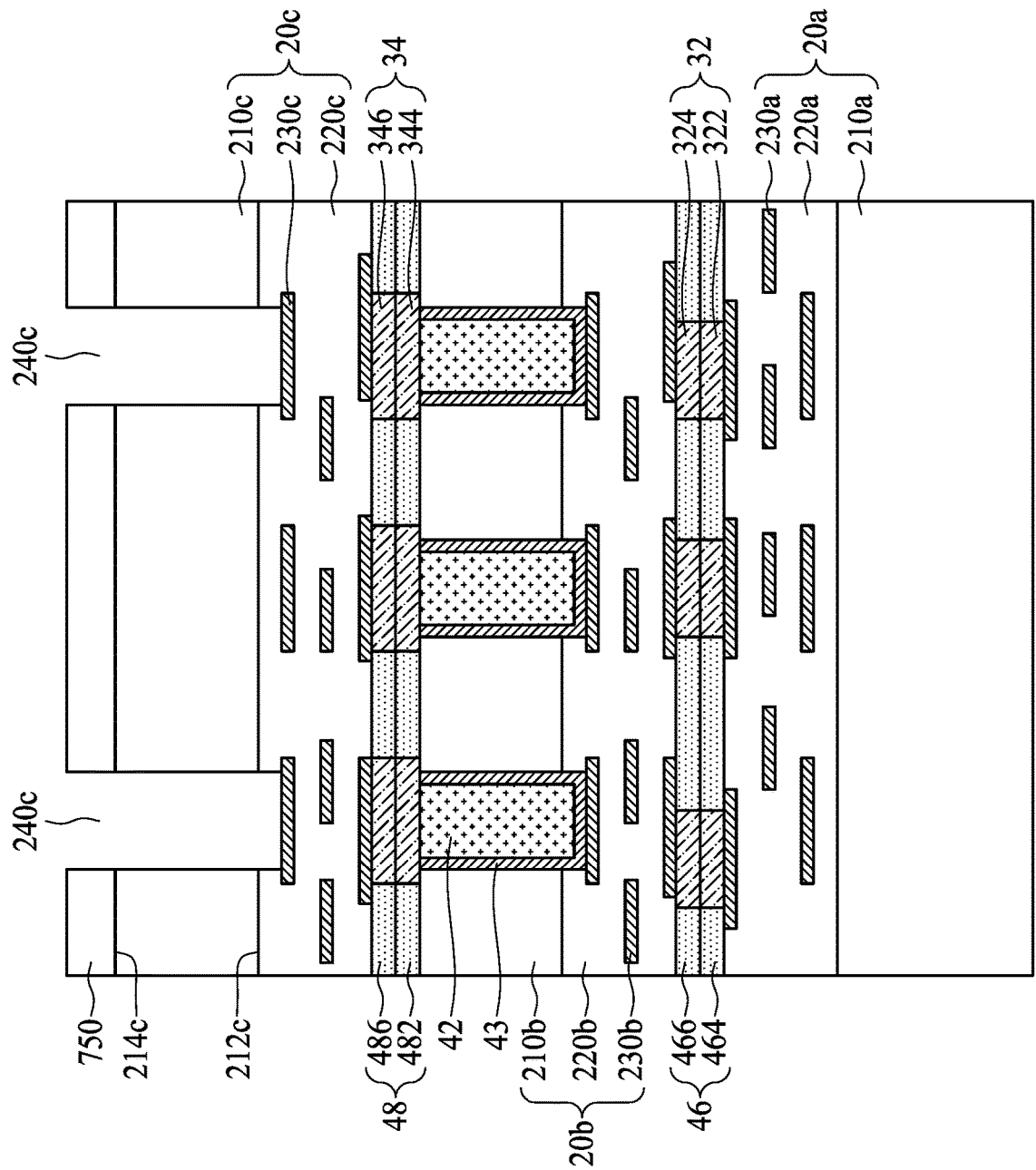

Referring to FIG. 22, in some embodiments, at least one second opening 240c is formed to expose one or more third metal lines 230c closest to the third substrate 210c according to a step 632 in FIG. 3. In some embodiments, the second opening 240c is formed by providing a fifth mask 750 on a third back surface 214c of the third die 30c, and performing a fifth etching process to remove portions of the third substrate 210c and the third ILD layer 220c that are not covered by the fifth mask 750. The fifth mask 750 is removed after the fifth etching process is performed.

Figure 23:
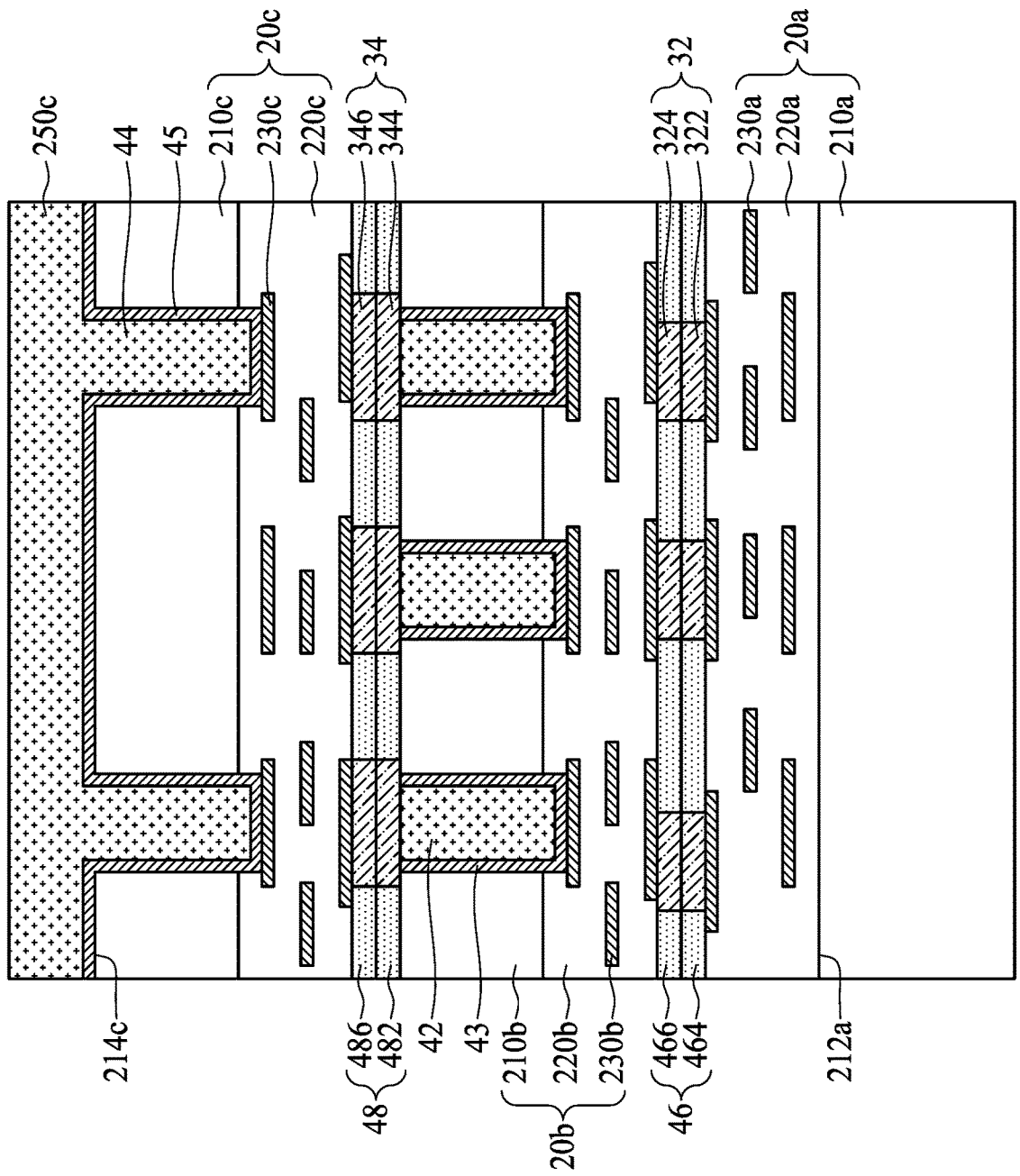

Referring to FIG. 23, in some embodiments, a third barrier liner 45 is optionally deposited on the third back surface 214c and in the second opening 240c according to a step 634 in FIG. 3. In some embodiments, the second barrier liner 45 has a substantially uniform thickness. Next, a second conductive material 250c is deposited on the second barrier liner 45 according to a step 636 in FIG. 3. In some embodiments, the materials and formation methods of the second barrier liner 45 and the second conductive material 250b are essentially the same as those of the first barrier liner 43 and the first conductive material 250a.

Figure 24:
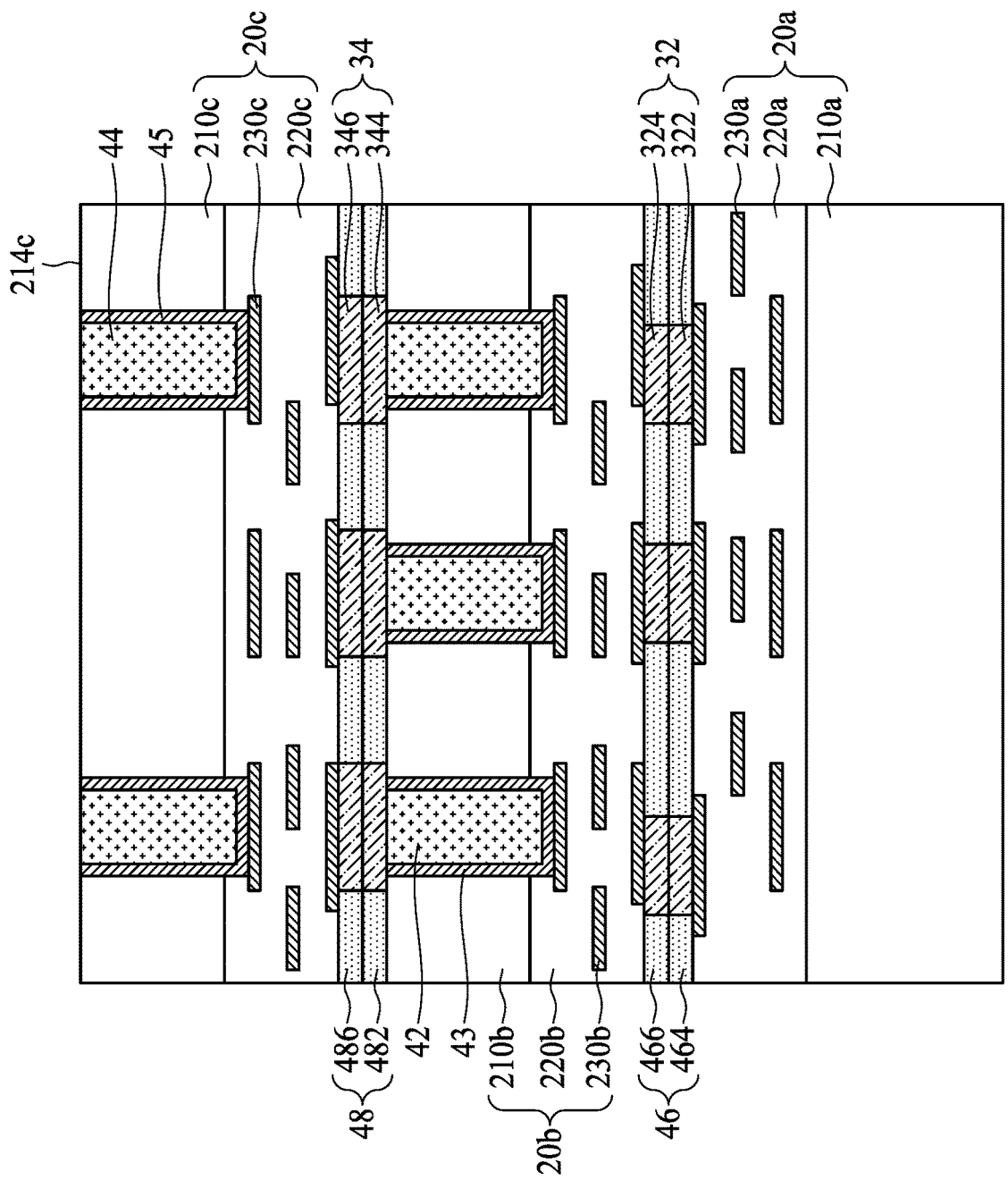

Referring to FIG. 24, in some embodiments, a second planarizing process is performed to expose the third back surface 214c according to a step 638 in FIG. 3. Accordingly, one or more second plugs 44 are formed. Portions of the second barrier liner 45 and the second conductive material 250c are removed during the second planarizing process to expose the third substrate 210c.

Figure 25:
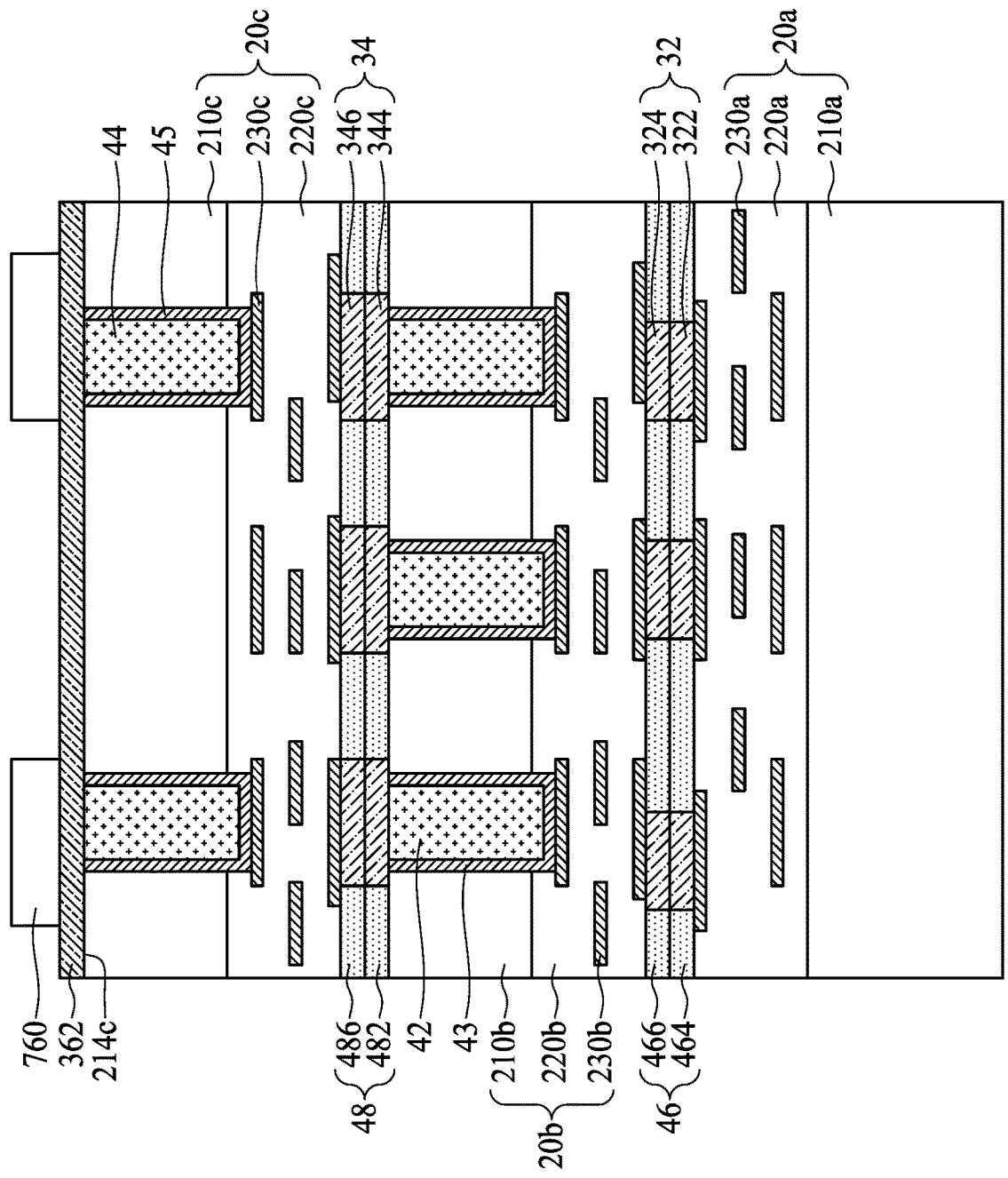
Figure 26:
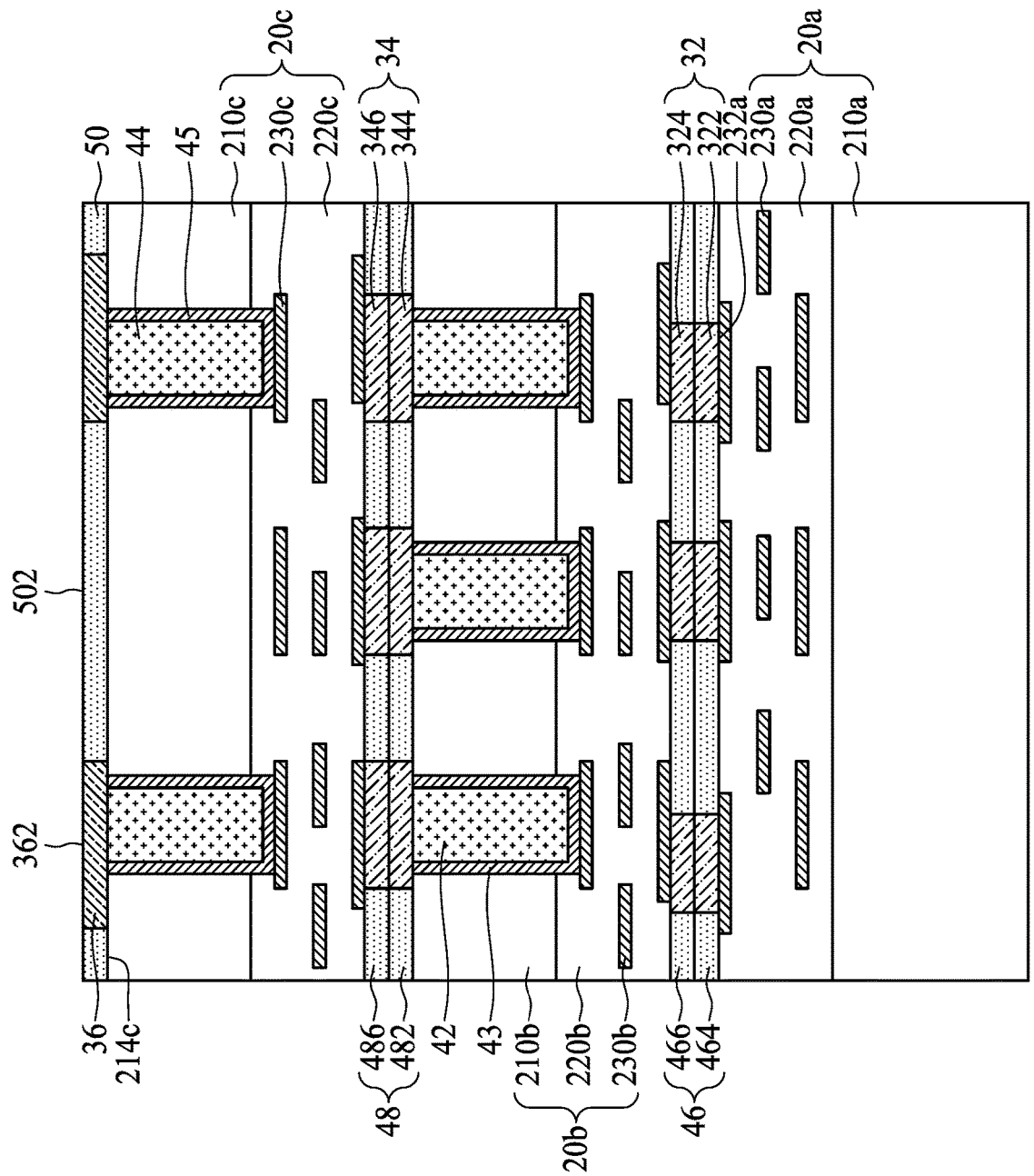

Referring to FIGS. 25 and 26, in some embodiments, a second precursor layer 362 is deposited on the third back surface 214c, the second plugs 44 and the second barrier liner 45 according to a step 640 in FIG. 3. In some embodiments, the materials and formation methods of the second precursor layer 362 are essentially the same as those of the first precursor layer 342.

Next, a sixth mask 760 is provided on the second precursor layer 362 and a sixth etching process is performed to form a third redistribution layer 36 according to a step 642 in FIG. 3. In some embodiments, the second plugs 44 are disposed beneath the sixth mask 760.

Next, a passivation layer 50 is deposited on the third substrate 210c to cover the third back surface 214c and encircle the third redistribution layer 36. In some embodiments, the third dielectric layer 50, including oxide, may be formed using a CVD process. In some embodiments, the passivation layer 50 has a top surface 502 that is coplanar with a top surface 362 of the third redistribution layer 36.

Figure 27:
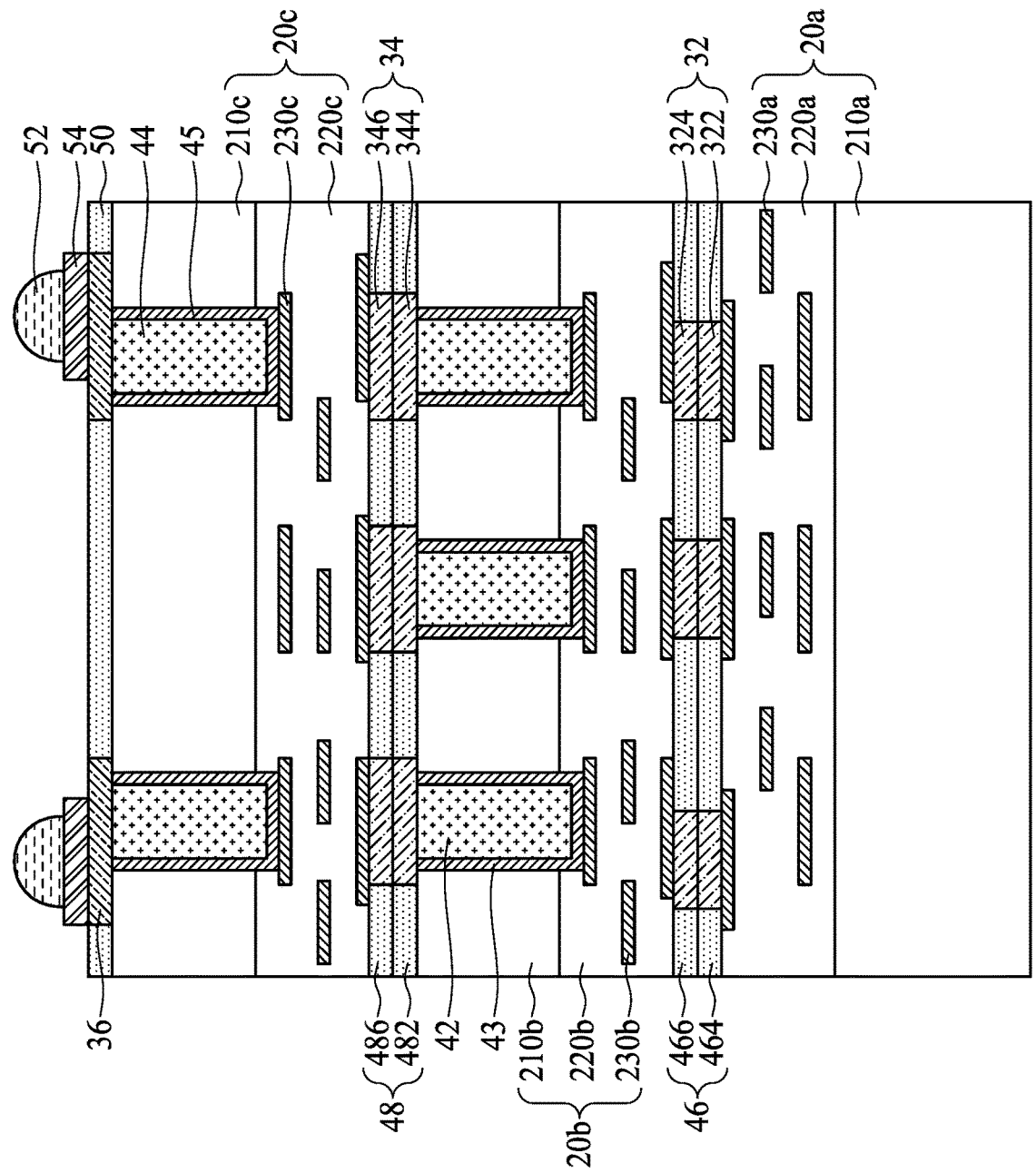

Referring to FIG. 27, in some embodiments, at least one UBM member 54 is formed on the third redistribution layer 36, and at least one solder bump 52 is disposed on the UBM member 54 according to a step 644 in FIG. 3. In some embodiments, the solder bump 52 is mounted by initially placing a solder flux (not shown) on the UBM member 54, and once the solder bump 52 is in contact with the solder flux, a reflow may be performed to reflow the material of the solder bump 52 and the solder flux to physically bond the solder bump 52 to the UBM member 54.

Figure 28:
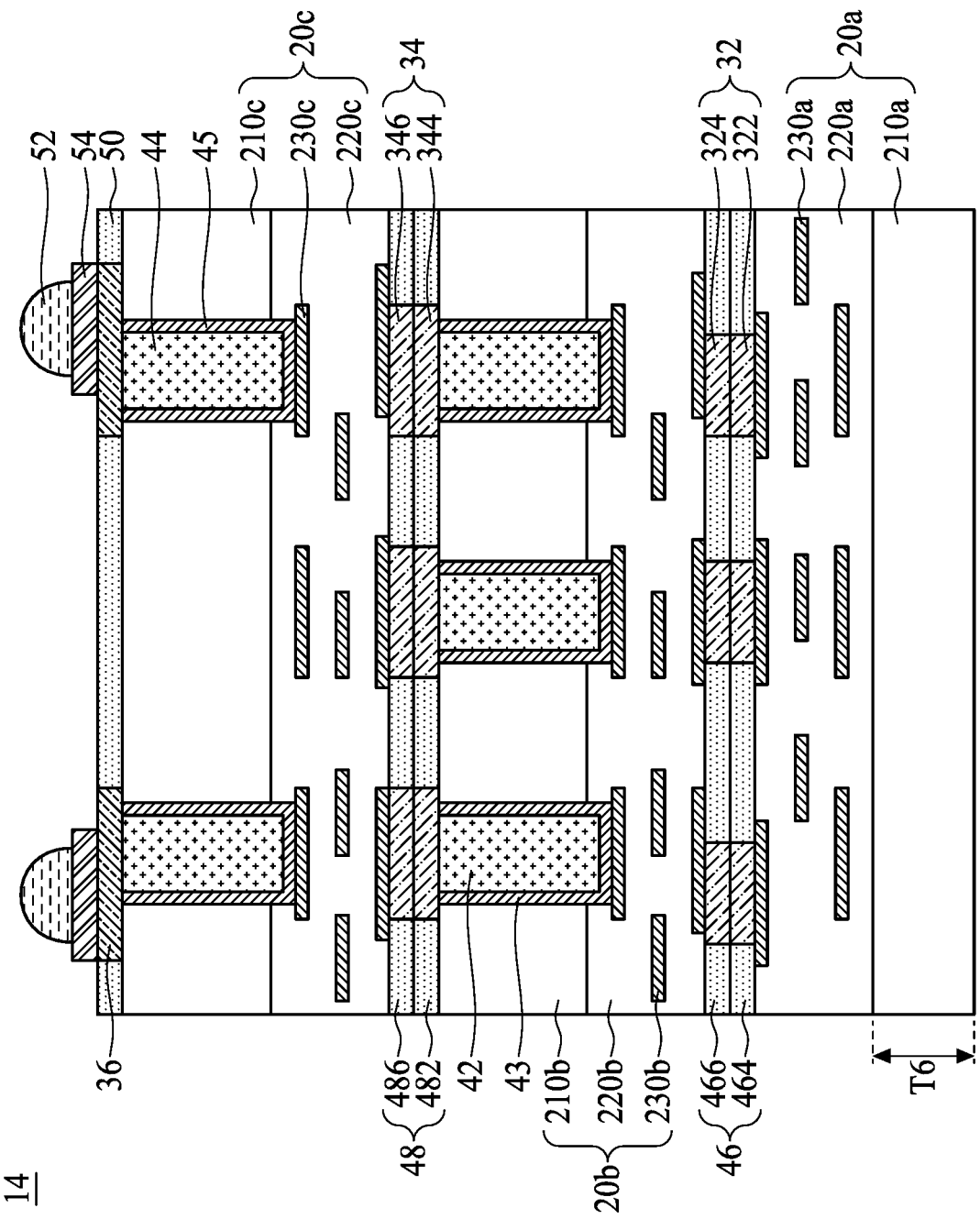

Referring to FIG. 28, in some embodiments, a grinding process is performed to thin the first substrate 210a according to a step 646 in FIG. 3. Accordingly, the die assembly 14 is completely formed. In some embodiments, the first substrate 210a is thinned to a thickness T6, such as less than or equal to about 50 μm, to reduce overall size of the die assembly 14.

One aspect of the present disclosure provides a die assembly that includes a first die, a second die, a third die, at least one first plug, a first redistribution layer and a second redistribution layer. The first die includes a first substrate and a plurality of first metal lines disposed over the first substrate. The second die includes a second substrate and a plurality of second metal lines disposed over the second substrate, wherein the first die is stacked on the second die and the second metal lines face the first metal lines. The third die includes a third substrate and a plurality of third metal lines over the third substrate, wherein the second die is stacked on the third die and the third metal lines face the second substrate. The first plug penetrates through the second substrate to connect to at least one of the second metal lines. The first redistribution layer physically connects at least one of the first metal lines to at least one of the second metal lines, and the second redistribution layer physically connects at least one of the third metal lines to the first plug.

One aspect of the present disclosure provides a method of manufacturing a die assembly. The method includes steps of providing a first die comprising a first substrate and a plurality of first metal lines over the first substrate; forming a first re-routing layer physically connected to at least one of the first metal lines; providing a second die comprising a second substrate and a plurality of second metal lines over the second substrate; forming a second re-routing layer aligned with the first re-routing layer and in contact with at least one of the second metal lines; bonding the first re-routing layer and the second re-routing layer to form a first redistribution layer; forming at least one first plug penetrating through the second substrate and contacting at least one of the second metal lines; forming a third re-routing layer contacting the first plug; providing a third die comprising a third substrate and a plurality of third metal lines over the third substrate; forming a fourth re-routing layer aligned with the third re-routing layer and in contact with at least one of the third metal lines; and bonding the third re-routing layer to the fourth re-routing layer to form a second redistribution layer.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A die assembly, comprising:
   a first die comprising a first substrate, a first inter-layer dielectric (ILD) layer disposed on the first substrate, and a plurality of first metal lines disposed in the first ILD layer and over the first substrate, wherein a surface of at least one of the first metal lines exposed through the first ILD layer is coplanar with a first surface of the first ILD layer;
   a second die comprising a second substrate, a second inter-layer dielectric (ILD) layer disposed on the second substrate, and a plurality of second metal lines disposed in the second ILD layer and over the second substrate, wherein a surface of at least one of the second metal lines exposed through the second ILD layer is coplanar with a second surface of the second ILD layer, and the first die is stacked on the second die and the second metal lines face the first metal lines, wherein the second surface of the second ILD layer faces the first surface of the first ILD layer;
   a third die comprising a third substrate, a third inter-layer dielectric (ILD) layer disposed on the third substrate, and a plurality of third metal lines disposed in the third ILD layer and over the third substrate, wherein the second die is stacked on the third die and the third metal lines face the second substrate;
   at least one first plug penetrating through the second substrate to connect to at least one of the second metal lines in the second ILD layer;
   a first redistribution layer physically connecting the at least one of the first metal lines exposed through the first ILD layer to the at least one of the second metal lines exposed through the second ILD layer, wherein the first redistribution layer is directly in contact with the surface of the at least one of the first metal lines and the surface of the at least one of the second metal lines; and
   a second redistribution layer physically connecting at least one of the third metal lines exposed through the third ILD layer to the first plug.

2. The die assembly of claim 1, wherein the first redistribution layer is aligned with the first metal line farthest from the first substrate, and the second redistribution layer is aligned with the first plug.

3. The die assembly of claim 2, further comprising:
   a first dielectric layer between the first die and the second die and encircling the first redistribution layer; and
   a second dielectric layer between the second die and the third die and encircling the second redistribution layer.

4. The die assembly of claim 1, further comprising at least one second plug penetrating through the third substrate and contacting at least one of the third metal lines.

5. The die assembly of claim 4, further comprising:
   a third redistribution layer in contact with the at least one second plug; and
   a passivation layer encircling the third redistribution layer.

6. The die assembly of claim 5, further comprising at least one solder bump electrically coupled to the third redistribution layer.

7. The die assembly of claim 4, further comprising:
   a first barrier liner between the second substrate and the first plug and between the second metal line and the first plug; and
   a second barrier liner between the third substrate and the second plug and between the third metal line and the second plug.

8. A method of manufacturing a die assembly, comprising:
   providing a first die comprising a first substrate, a first inter-layer dielectric (ILD) layer disposed on the first substrate, and a plurality of first metal lines disposed in the first ILD layer and over the first substrate, wherein a surface of at least one of the first metal lines exposed through the first ILD layer is coplanar with a first surface of the first ILD layer;
   forming a first re-routing layer physically connected to the at least one of the first metal lines exposed through the first ILD layer;
   providing a second die comprising a second substrate, a second inter-layer dielectric (ILD) layer disposed on the second substrate, and a plurality of second metal lines disposed in the second ILD layer and over the second substrate, a surface of at least one of the second metal lines exposed through the second ILD layer is coplanar with a second surface of the second ILD layer, wherein the second surface of the second ILD layer faces the first surface of the first ILD layer;
   forming a second re-routing layer aligned with the first re-routing layer and in contact with the at least one of the second metal lines exposed through the second ILD layer;
   bonding the first re-routing layer and the second re-routing layer to form a first redistribution layer;
   forming at least one first plug penetrating through the second substrate and contacting the at least one of the second metal lines in the second ILD layer;
   forming a third re-routing layer contacting the first plug;
   providing a third die comprising a third substrate, a third inter-layer dielectric (ILD) layer disposed on the third substrate, and a plurality of third metal lines disposed in the third ILD layer and over the third substrate;

forming a fourth re-routing layer aligned with the third re-routing layer and in contact with at least one of the third metal lines exposed through the third ILD layer; and bonding the third re-routing layer to the fourth re-routing layer to form a second redistribution layer, wherein the first redistribution layer is directly in contact with the surface of the at least one of the first metal lines and the surface of the at least one of the second metal lines.

9. The method of claim 8, further comprising:

depositing a blanket dielectric over the first substrate and connected to the first metal lines farthest from the first substrate;

performing a first etching process to expose portions of the first metal line, farthest from the first substrate, through the blanket dielectric, thus forming a first dielectric film; and performing a plating process to form the first re-routing layer on the first metal line exposed through the first dielectric film.

10. The method of claim 9, further comprising:

depositing a second dielectric film to cover portions of the second metal line farthest from the second substrate before the forming of the second re-routing layer; and bonding the first dielectric film and the second dielectric film simultaneously with the bonding of the first re-routing layer and the second re-routing layer.

11. The method of claim 8, wherein the forming of the third re-routing layer comprises:

depositing a first precursor layer on the second substrate and the first plug; and patterning the first precursor layer to remove portions of the first precursor layer that do not contact the first plug, wherein the third re-routing layer is aligned with the first plug.

12. The method of claim 8, further comprising:

depositing a third dielectric film to surround the third re-routing layer;

depositing a fourth dielectric film to cover portions of the third metal line farthest from the third substrate before the forming of the fourth re-routing layer; and bonding the third dielectric film and the fourth dielectric film simultaneously with the bonding of the third re-routing layer and the fourth re-routing layer.

13. The method of claim 8, further comprising:

forming at least one second plug penetrating through the third substrate and contacting at least one of the third metal lines; and forming a third redistribution layer in contact with the second plug.

14. The method of claim 13, further comprising performing a grinding process to thin the first substrate after the forming of the third redistribution layer.

* * * * *